US 6,613,399 B2

(12) United States Patent
Miyamoto et al.

(10) Patent No.: US 6,613,399 B2
(45) Date of Patent: *Sep. 2, 2003

(54) PRODUCTION PROCESSES OF PRINTED SUBSTRATE, ELECTRON-EMITTING ELEMENT, ELECTRON SOURCE AND IMAGE-FORMING APPARATUS

(75) Inventors: Masahiko Miyamoto, Kawasaki (JP); Mitsutoshi Hasegawa, Yokohama (JP); Kazuhiro Sando, Atsugi (JP); Kazuya Shigeoka, Tokyo (JP); Masato Yamanobe, Machida (JP); Takayuki Teshima, Atsugi (JP); Toshifumi Yoshioka, Hiratsuka (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/045,688

(22) Filed: Mar. 23, 1998

(65) Prior Publication Data

US 2002/0015800 A1 Feb. 7, 2002

(30) Foreign Application Priority Data

Mar. 21, 1997 (JP) .............................. 9-085546
Mar. 20, 1998 (JP) ........................... 10-090621

(51) Int. Cl.⁷ .............................. B05D 3/04; B05D 3/06
(52) U.S. Cl. ....................... 427/558; 427/553; 427/261; 427/269; 427/287; 427/299; 427/421; 427/77
(58) Field of Search ................................. 427/553, 299, 427/261, 287, 269, 421, 558, 77

(56) References Cited

U.S. PATENT DOCUMENTS

| 4,503,437 | A | | 3/1985 | Katzschner | 346/1.1 |
|---|---|---|---|---|---|
| 5,847,495 | A | * | 12/1998 | Yamanobe et al. | 313/310 |
| 6,008,569 | A | | 12/1999 | Yamanobe | 313/310 |
| 6,060,113 | A | | 5/2000 | Banno et al. | 427/78 |
| 6,106,906 | A | * | 8/2000 | Matsuda et al. | 427/558 |
| 6,184,610 | B1 | * | 2/2001 | Shibata et al. | 313/309 |
| 6,210,245 | B1 | | 4/2001 | Sando et al. | 445/6 |
| 6,220,912 | B1 | | 4/2001 | Shigeoka et al. | 445/24 |
| 6,221,426 | B1 | | 4/2001 | Yamanobe | 427/77 |
| 6,228,435 | B1 | | 5/2001 | Yoshikawa et al. | 427/489 |

FOREIGN PATENT DOCUMENTS

| EP | 0 409 440 | 1/1991 |
|---|---|---|
| EP | 0 572 314 | 12/1993 |

(List continued on next page.)

OTHER PUBLICATIONS

Kirk–Othmer, *Concise Encyclopedia of Chemical Technology*, John Wiley & Sons, Inc., p. 664, 1985.*

(List continued on next page.)

Primary Examiner—Shrive P. Beck
Assistant Examiner—Kirsten Crockford Jolley
(74) Attorney, Agent, or Firm—Fitzpatrick, Cella, Harper & Scinto

(57) ABSTRACT

Disclosed herein is a process for producing a printed substrate, comprising a step of applying droplets of a liquid containing a material for a desired component to be formed on a substrate to the surface of the substrate to form the component on the substrate, wherein the process comprises, prior to the step of applying the droplets to the substrate surface, a step of subjecting the substrate to a surface treatment in such a manner that the contact angle of the droplet applied with the surface of the substrate falls within a range of from 20° to 50°.

40 Claims, 18 Drawing Sheets

FOREIGN PATENT DOCUMENTS

| | | |
|---|---|---|
| EP | 0 665 449 | 8/1995 |
| EP | 0 717 428 | 6/1996 |
| EP | 0 743 191 | 11/1996 |
| EP | 0 758 629 A1 | 2/1997 |
| JP | 01-031332 | 2/1989 |
| JP | 01-283749 | 11/1989 |
| JP | 02-257552 | 10/1990 |
| JP | 08-171850 | 7/1996 |
| JP | 8-179113 | 7/1996 |
| JP | 9-33711 | 2/1997 |
| JP | 9-069334 | 3/1997 |

OTHER PUBLICATIONS

English translation of JP 9–69334.

English translation of JP 9–33711.

English translation of JP 8–179113.

Chinese Office Action dated Nov. 8, 2002 (with English translation).

Dyke and Dolan, "Field Emission," *Adv. Electronics and Electron Physics*, vol. VIII (1956), pp. 89–185.

Spindt et al., "Physical properties of thin–film field emission cathodes with molybdenum cones," *J. Appl. Physics,* vol. 47, No. 12 (1976), pp. 5248–5263.

Mead, "Operation of Tunnel–Emission Devices," *J. Appl. Physics,* vol. 32, No. 4 (1961), pp. 646–652.

Elinson, et al., "The Emission of Hot Electrons and the Field Emission of Electrons from Tin Oxide," *Radio Eng. and Electronic Physics* (1965), pp. 1290–1296.

Dittmer, "Electrical Conduction and Electron Emission Of Discontinuous Thin Films," *Thin Solid Films,* vol. 9 (1972) pp. 317–328.

Hartwell and Fonstad, "Strong Electron Emission From Patterned Tin–Indium Oxide Thin Films," *Int. Electron Devices Meeting Tech. Digest* (1975), pp. 519–521.

Araki, et al., "Electroforming and Electron Emission of Carbon Thin Films," *J. Vacuum Soc. Japan,* vol. 26, No. 1 (1983), pp. 22–29.

\* cited by examiner

HYDROLYSIS

PRODUCTION PROCESSES OF PRINTED SUBSTRATE, ELECTRON-EMITTING ELEMENT, ELECTRON SOURCE AND IMAGE-FORMING APPARATUS

BACKGROUND OF THE INVENTION

1. Field of the Invention

The present invention relates to a process for producing printed substrates on which electric and electronic devices, particularly, components of electric and electronic devices for image-forming apparatus and the like have been patterned. The present invention also relates to processes for producing electron-emitting elements, electron sources and image-forming apparatus using such a process.

2. Related Background Art

The electron emitting element has been heretofore known in two broadly divided types, i.e. the thermoelectron emitting element and the cold cathode electron emitting element. The cold cathode electron emitting element comes in such types as the field emission type (hereinafter referred to as "FE type"), metal/insulating layer/metal type (hereinafter referred to as "MIM type"), and surface conduction type, for example.

As examples of the FE type electron emitting element, those elements which are disclosed in W. P. Dyke & W. W. Doran, "Field Emission," Advances in Electronics and Electron Physics, 8, 89 (1956) or C. A. Spindt, "Physical Properties of Thin-film Field Emission Cathodes with Molybdenium Cones," J. Appl. Phys., 47, 5248 (1976) have been known.

As an example of the MIM type electron emitting element, the element which is disclosed in C. A. Mead, "Operation of Tunnel-Emission Devices," J. Appl. Phys., 32, 646 (1961) has been known.

As an example of the surface conduction type electron emitting element, the element which is disclosed in M. I. Elinson, "The Emission of Hot Electrons and the Field Emission of Electrons from Tin-Oxide," Radio Eng. Electron Phys., 10, 1290 (1965) has been known.

The surface conduction type electron emitting element utilizes a phenomenon that flow of an electric current parallel to the surface of a thin film of small area formed on a substrate results in emission of electrons. The surface conduction type electron emitting elements include the element using a thin film of Au reported in G. Dittmer, "Electrical Conduction and Electron Emission of Discontinuous Thin Films," Thin Solid Films, 9, 317 (1972), the element using a thin film of $In_2O_3/SnO_2$ reported in M. Hartwell and C. G. Fonstad, "Strong Electron Emission from Patterned Tin-Indium Oxide Thin Films," IEEE Trans. ED Conf., 519 (1975), and the element using a thin film of carbon reported in Hisashi Araki et al., "Electroforming and Electron Emission of Carbon Thin Films," J. Vacuum Soc. Japan, Vol. 26, No. 1, page 22 (1983) in addition to the element using a thin film of $SnO_2$ proposed by Elinson as mentioned above.

As a typical example of the surface conduction type electron emitting element, the construction of the element proposed by M. Hartwell et al. as mentioned above is illustrated in the form of a model in FIG. 23. In the figure, 1 denotes a substrate and 4 an electroconductive thin film which is formed of a metal oxide in the pattern shaped like the letter H by sputtering and so forth and made to incorporate therein an electron emitting portion 5 by a treatment of electrification called an energization forming which will be specifically described herein below. As illustrated in the figure, the interval L between element electrodes 2 and 3 is set at a length in the range of 0.5 to 1 mm and the width W' of the thin film at 0.1 mm.

In the surface conduction type electron emitting element of this class, the practice of subjecting the electroconductive thin film 4 to the treatment of electrification called energization forming in advance of the emission of electrons thereby forming the electron emitting part 5 thereof has been in vogue. To be specific, the energization forming consists in applying a DC voltage or very gradual elevation of voltage to the opposite terminals of the electroconductive thin film 4 mentioned above thereby forcing this thin film to sustain local fracture, deformation, or degeneration and, as a result, allowing formation of the electron emitting portion 5 in an electrically highly resistant state. The treatment, for example, locally inflicts a fisure to the electroconductive thin film 4 to enable this thin film to emit electrons from the neighborhood of the fisure. The surface conduction type electron emitting element which has undergone the energization forming treatment mentioned above is such that it is enabled to effect emission of electrons from the electron emitting part 5 in response to the application of voltage to the electroconductive thin film 4 and the consequent induction of flow of an electric current through the element.

The surface conduction type electron emitting element of the quality described above enjoys simplicity of construction and allows for the manufacture thereof the use of the conventional technique of semiconductor production. Therefore, applied studies such as a charged beam source and a display device, in which the characteristics of the above-mentioned surface conduction type electron emitting element are utilized, have been performed.

As an example where many surface conduction type electron-emitting elements are arranged, there is an electron source in which surface conduction type electron-emitting elements are arranged in parallel, called a ladder-type arrangement as described below, and connected at the respective ends with wiring (may referred to as common wiring), and many rows of elements thus arranged are arranged in parallel lines (for example, Japanese Patent Application Laid-Open No. 64-031332, Japanese Patent Application Laid-Open No. 1-283749, Japanese Patent Application Laid-Open No. 2-257552, etc.). In recent years, flat-type display devices using liquid crystals have become popular in place of CRT in the field of image-forming apparatuses, such as display devices in particular. However, they have involved such problems that a back light must be provided because they are not self-luminous. There has been a demand for development of a self-luminous type display device. An example of the self-luminous type display device includes an image-forming apparatus which is a display device comprising in combination the above-described electron source, in which many surface conduction type electron-emitting elements are arranged, and phosphors which emit visible light by virtue of electrons emitted from the electron source.

In the production process of an electroconductive thin film in the surface conduction type electron-emitting element according to the above prior art documents, the electroconductive thin film is formed and then patterned by means of photolithographic etching in a semiconductor process. Therefore, large-scale photolithography-etching equipment is essential to the formation of the elements over a wide area. Such a process has thus involved drawbacks that the number of steps is increased, and the production cost is high.

Therefore, as a production process advantageous to a wide area in a production process of a surface conduction type electron-emitting element, it has been proposed in Japanese Patent Application Laid-Open No. 8-171850 to apply droplets of an organic metal-containing aqueous solution onto a substrate by an ink-jet system to form an electroconductive thin film in the desired form without using the photolithographic etching in the step of patterning the electroconductive thin film in the desired form. In this publication, it has also been proposed to coat the substrate with a liquid containing a water repellent prior to the step of applying the organic metal-containing aqueous solution.

It has also been proposed to produce a color filter used in a liquid crystal display device by means of a printing or ink-jet method. The use of the ink-jet method has a possibility that patterning of pixels may be conducted with higher definition compared with the printing method.

SUMMARY OF THE INVENTION

It is an object of the present invention to provide a production process of a printed substrate, by which high-definition patterning can be conducted on a substrate.

Another object of the present invention is to provide a process for producing an electron-emitting element having good electron emission characteristics.

A further object of the present invention is to provide a process for producing an electron source having a plurality of electron-emitting elements and improved in evenness of electron emission characteristics between electron-emitting elements.

A still further object of the present invention is to provide a process for producing an image-forming apparatus which can form high-quality images.

A yet still further object of the present invention is to provide production processes of an electron source and an image-forming apparatus, by which yield can be enhanced.

The above objects can be achieved by the present invention described below.

According to the present invention, there is thus provided a process for producing a printed substrate, comprising a step of applying droplets of a liquid containing a material for a desired component to be formed on a substrate to the surface of the substrate to form the component on the substrate, wherein the process comprises, prior to the step of applying the droplets to the substrate surface, a step of subjecting the substrate to a surface treatment in such a manner that the contact angle of the droplet applied with the surface of the substrate falls within a range of from 20° to 50°.

According to the present invention, there is also provided a process for producing an electron-emitting element comprising an electroconductive thin film having an electron-emitting part between electrodes, wherein the step of forming the electroconductive thin film, in which the electron-emitting part is formed, comprises a step of applying droplets of a liquid containing a material for the electroconductive thin film to a substrate, on which a pair of electrodes has been arranged, so as to extend over the electrodes, and prior to the step of applying the droplets, a step of subjecting the substrate to a surface treatment in such a manner that the contact angle of the droplet with the surface of the substrate falls within a range of from 20° to 50°.

According to the present invention, there is further provided a process for producing an electron source in which a plurality of electron-emitting elements each comprising an electroconductive thin film having an electron-emitting part between electrodes are arranged on a substrate, wherein each of the electron-emitting elements is produced by the process described above.

According to the present invention, there is further provided a process for producing an image-forming apparatus comprising an electron source in which a plurality of electron-emitting elements each comprising an electroconductive thin film having an electron-emitting part between electrodes are arranged on a substrate, and an image-forming member capable of forming images by virtue of irradiation of electrons from the electron source, wherein each of the electron-emitting elements is produced by the process described above.

DETAILED DESCRIPTION OF THE PREFERRED EMBODIMENTS

The present invention permits higher-definition patterning when components of electric or electronic devices are patterned on a substrate. The term "printed substrate" as used in the present invention means a substrate on which the components of electric or electronic devices have been patterned and includes, for example, color filter substrates of liquid crystal displays, substrates having driving electrodes for various displays such as liquid crystal displays, plasma displays and electron beam displays, and substrates on which components of an electron source have been patterned.

The present invention includes, upon forming a desired component on the surface of a substrate by applying droplets, a step of adjusting the surface energy of the substrate to a desired value prior to the application of the droplets for forming the desired component to the substrate surface. In the present invention, prior to the application of the droplets, the surface energy of the substrate is preferably adjusted in such a manner that the contact angle of the droplet applied with the surface of the substrate falls within a range of from 20° to 50°. The present invention also includes, upon forming a desired component on the surface of a substrate, on which another component different in material from the substrate is provided, by applying droplets, a step of adjusting the surface energy of both the substrate and the component provided on the substrate to desired values prior to the application of the droplets for forming the desired component to the substrate surface. In this case, prior to the application of the droplets, the surface energy of the substrate and the component provided on the substrate is preferably adjusted in such a manner that the contact angles of the droplet applied with both surfaces of the substrate and the component provided on the substrate both fall within a range of from 20° to 50°.

The present invention will hereinafter be described with reference to the preferred embodiments.

Preferred embodiments of the present invention are described below.

Figure 4A:
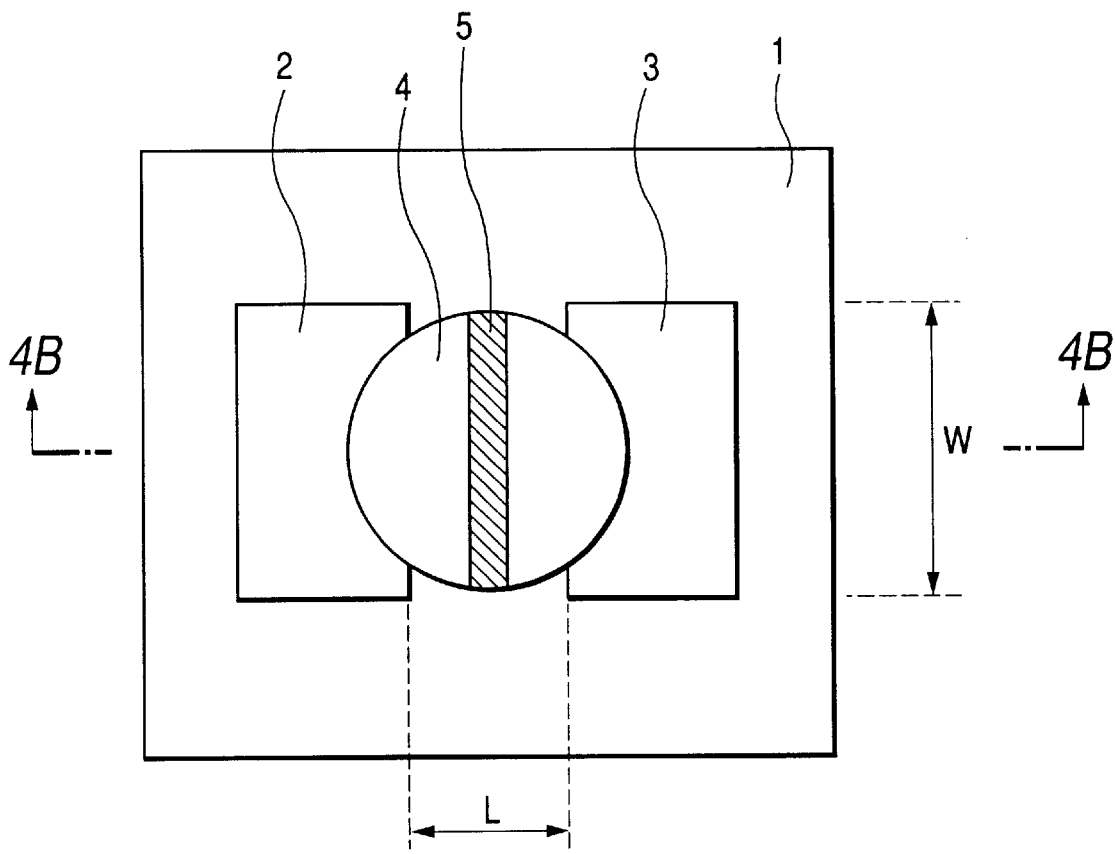
FIGS. 4A and 4B are a schematic plan view and cross-sectional view, respectively, illustrating the construction of a surface conduction type electron-emitting element to which the present invention is applied.
Figure 4B:
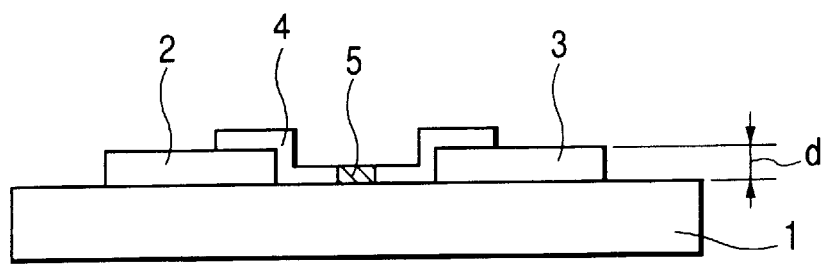

Firstly, a surface conduction type electron-emitting element is explained to which the present invention is applicable. FIG. 4A and FIG. 4B are a schematic plan view and a schematic sectional view illustrating the constitution of a surface-conduction type electron-emitting element to which the present invention is applicable. In FIG. 4A and FIG. 4B, the element comprises substrate 1, element electrodes 2,3, electroconductive thin film 4, and electron-emitting portion 5.

Substrate 1 may be made of quartz glass, low-impurity glass containing less content of impurity like Na, soda lime glass, a glass base plate having $SiO_2$ deposited on the surface, a ceramic base plate such as an alumina plate, or the like.

The materials for counter electrodes 2,3, which are opposite to each other, may be selected suitably from various electroconductive materials including metals such as Ni, Cr, Au, Mo, W, Pt, Ti, Al, Cu, and Pd, and alloys thereof; printed conductors constituted of a metal or a metal oxide such as Pd, As, Ag, Au, $RuO_2$, and Pd—Ag, and glass or the like; transparent conductors such as $In_2O_3$—$SnO_2$, and semiconductor materials such as polysilicon.

Spacing L between the element electrodes, length W of the element electrodes, the shape of electroconductive thin film 4, and so forth are designed to meet the practical use. Element electrode spacing L ranges preferably from several thousand Å to several hundred $\mu$m, more preferably from 1 $\mu$m to 100 $\mu$m in consideration of the voltage applied between the element electrodes.

Length W of the element electrodes ranges from several $\mu$ to several hundred $\mu$ in consideration of the resistivity of the electrodes and electron-emitting characteristics. Thickness d of element electrodes 2,3 ranges from 100 Å to 1 $\mu$m.

Electroconductive thin film 4 is preferably made from a fine particle film constituted of fine particles for achieving desired electron-emitting characteristics. The thickness of the film is designed in consideration of step coverage of element electrodes 2,3, the resistivity between element electrodes 2,3, the energization forming conditions mentioned later, and so forth. The thickness ranges preferably from several Å to several thousand Å, more preferably from 10 Å to 500 Å. The resistance ranges from $10^2$ to $10^7$ Ω/square in terms of $R_s$. Here the value $R_s$ is a function of R: $R=R_s(1/w)$, where R is the resistance of a thin film of thickness t, width w, and length l, and $R_s=\rho/t$ at a resistivity $\rho$ of the thin film material. Herein, the treatment is described regarding energization treatment as an example, but is not limited thereto. Any forming method is applicable which gives a high resistance state by fisure formation in the film.

Electroconductive film 4 may be constituted of a material including metals such as Pd, Pt, Ru, Ag, Au, Ti, In, Cu, Cr, Fe, Zn, Sn, Ta, W, and Pb; metal oxides such as PdO, $SnO_2$, $In_2O_3$, PbO, and $Sb_2O_3$; borides such as $HfB_2$, $ZrB_2$, $LaB_6$, $CeB_6$, $YB_4$, and $GdB_4$; carbides such as TiC, ZrC, HfC, TaC, SiC, and WC; nitrides such as TiN, ZrN, and HfN; semiconductors such as Si, and Ge; carbon; and the like.

The fine particle film herein is a film constituted of assemblage of fine particles, the fine structure including a state of dispersion of individual fine particles, and a state of fine particles being adjacent to each other or piled up (including an island-like structure containing an aggregation of fine particles). The diameter of the fine particle ranges preferably from several Å to 1 $\mu$m, preferably from 10 Å to 200 Å.

The electron-emitting part 5 is constituted of a space such as a crack formed in a part of the electroconductive thin film 4 and depends on the film thickness, nature and material of the electroconductive thin film 4, and energization forming and activation which will be described subsequently. In some cases, electroconductive particles having a particle size ranging from several angstroms to several hundred angstroms may exist in the interior of the electron-emitting part 5. The electroconductive fine particles include part of elements of a material forming the electroconductive thin film 4 or all the elements. A carbon-containing film is contained in the electroconductive thin film 4 at the point of the fissure and in the vicinity thereof. The carbon-containing film means a film formed of, for example, graphite or amorphous carbon. The film thickness thereof is preferably not greater than 500 Å, more preferably not greater than 300 Å.

A surface conduction type electron-emitting element to which the present invention is applied may have a construction illustrated in FIG. 21.

The surface conduction type electron-emitting element illustrated in FIG. 21 differs from the element illustrated in FIG. 4 in that the substrate 1 has a coating layer 6 on its surface. The coating layer 6 is provided in the process of production according to the present invention, which will be described in detail subsequently. In the present invention, a water-repellent layer such as a silane layer, or a titanium oxide layer is preferred. The coating layer 6 preferably has a thickness ranging from 1 nm to 300 nm.

The production process of the present invention will hereinafter be described taking a process for forming the electroconductive thin film of the surface conduction type electron-emitting element as an example.

Figure 1:
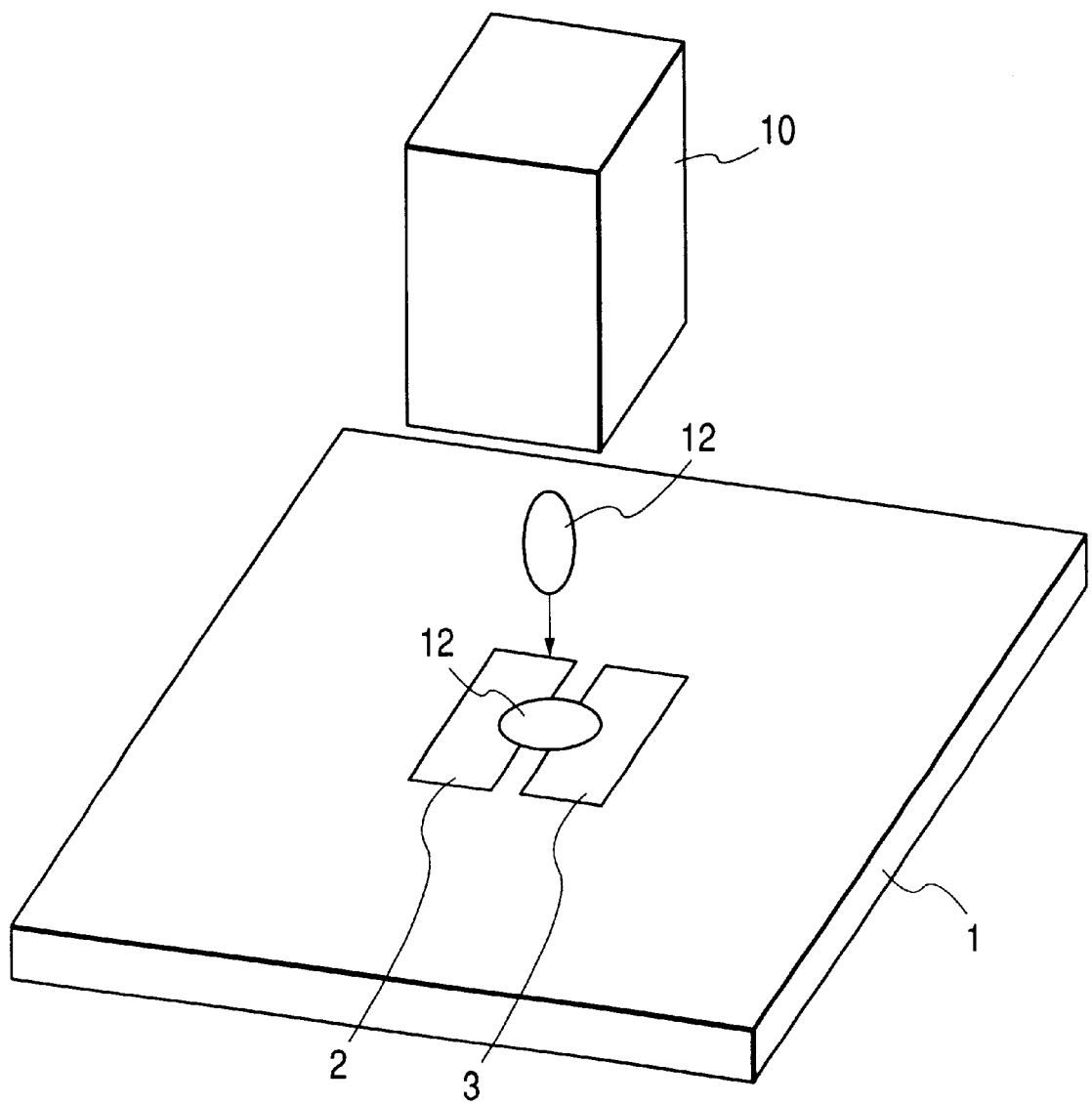
FIG. 1 is a schematic perspective view illustrating a process for forming an electroconductive thin film according to an example of the present invention.
Figure 2:
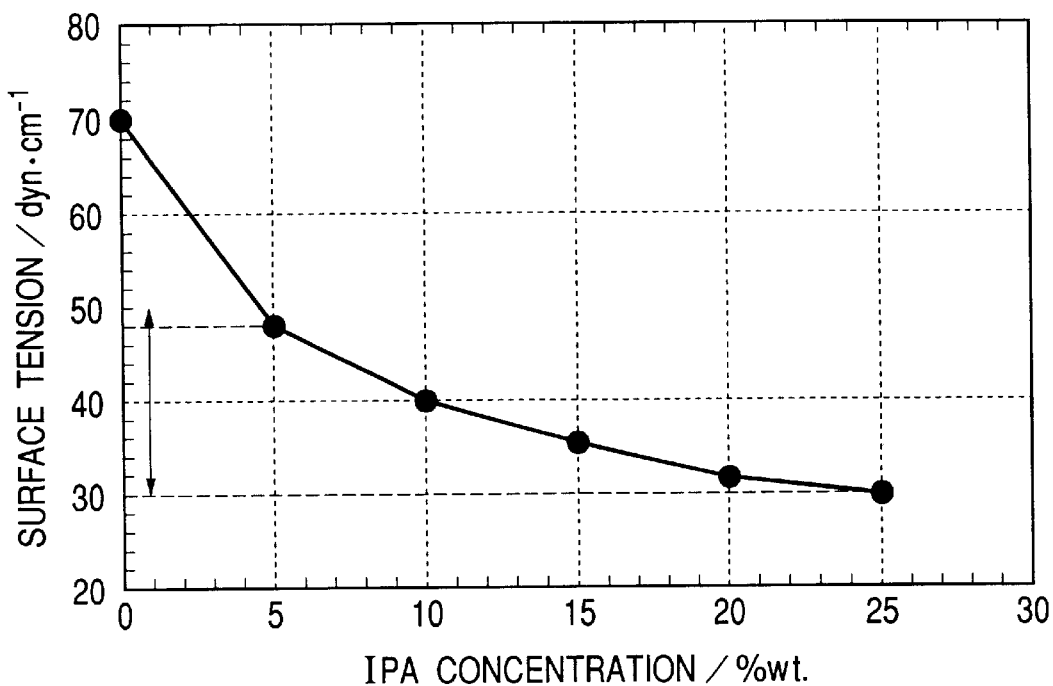
FIG. 2 diagrammatically illustrates surface tensions of inks used in an example of the present invention.
Figure 3:
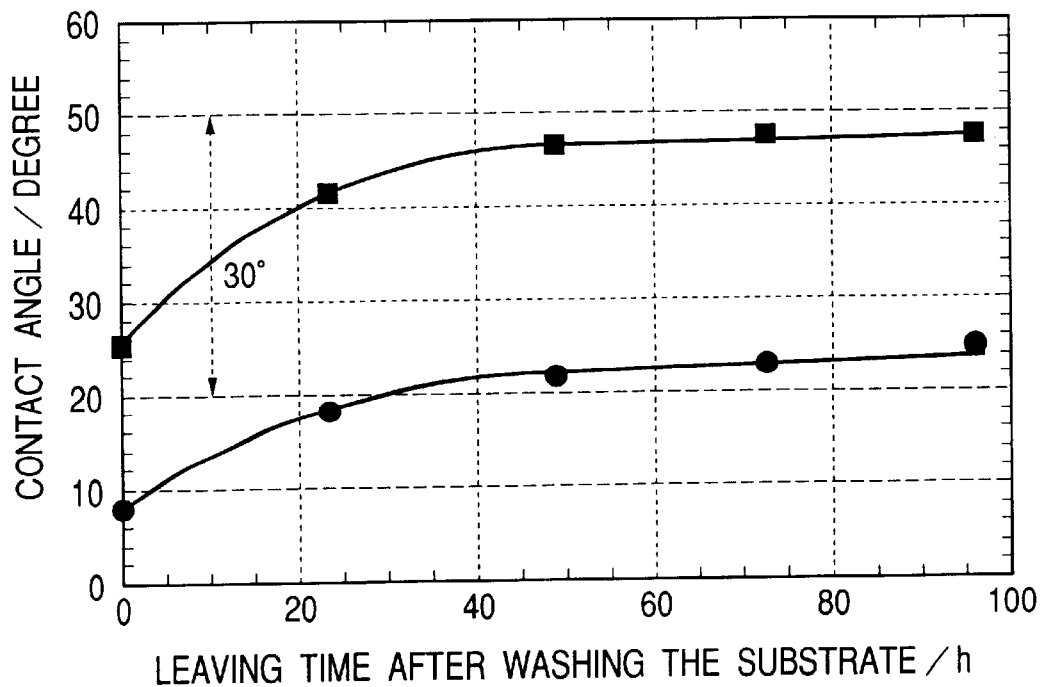
FIG. 3 diagrammatically illustrates the contact angles of the inks used in the example of the present invention.

FIG. 1 schematically illustrates a process for applying droplets according to the present invention. FIGS. 2 and 3 diagrammatically illustrate surface tensions of inks used in the present invention and contact angles thereof with the substrate and element electrode, respectively. In FIG. 1, reference numeral 1 indicates a substrate, 2 and 3 element electrodes, 10 an ink-jet head, and 12 a droplet.

As the mechanism applying the liquid, a mechanism that it is capable of discharging desired liquids in a constant amount is suitable, in particular, a mechanism of an ink-jet system is suitable which is capable of forming a liquid of about several ten nanograms. Each system of a so-called "piezo-jet system" utilizing mechanical energy from a piezo-element and so forth to eject the solution and a "bubble-jet system" utilizing a thermal energy from a heater to generate a bubble and then ejecting a solution in accordance with the generation of the bubble may be employed as the ink-jet system.

Figure 5:
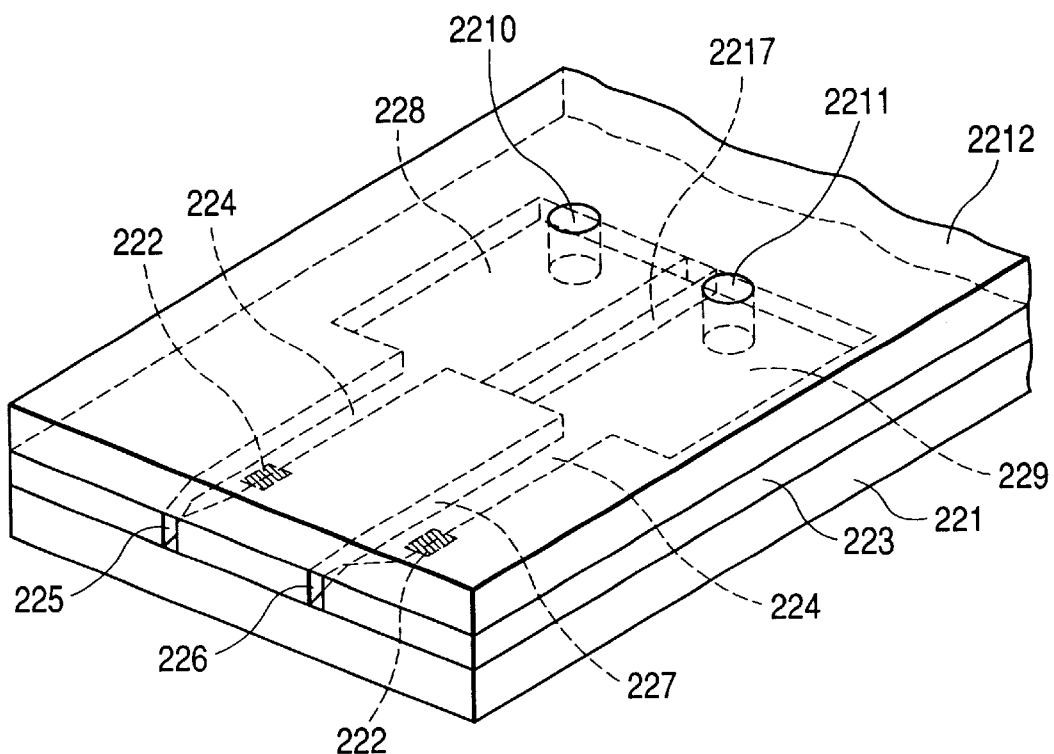
FIG. 5 illustrates the construction of an exemplary ink-jet system used in the present invention.
Figure 6:
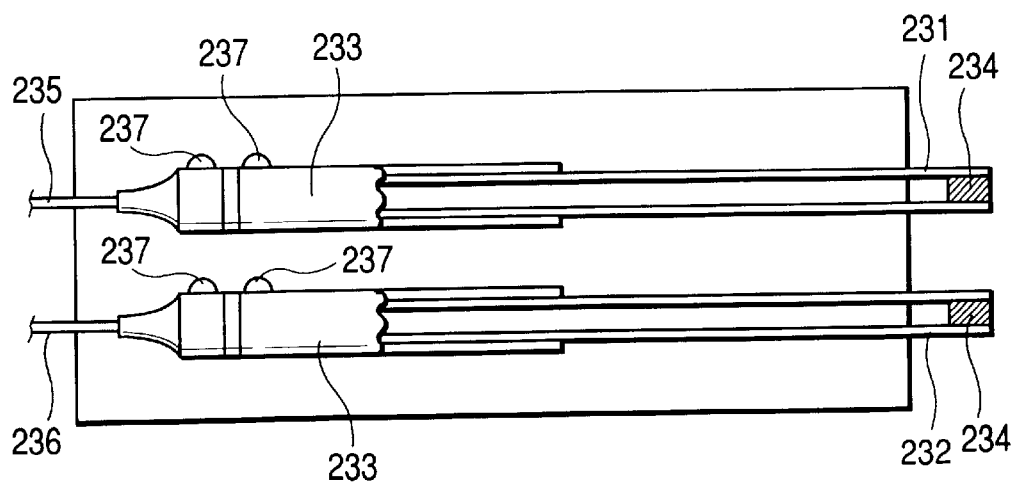
FIG. 6 illustrates the construction of another exemplary ink-jet system used in the present invention.

FIG. 5 and FIG. 6 illustrate examples of the ink-jet head units. FIG. 5 illustrates a head unit of a bubble jet system having substrate 221, heat-generating portion 222, supporting plate 223, liquid flow path 224, first nozzle 225, second nozzle 226, partition wall 227 partitioning the ink flow paths, ink liquid rooms 228,229, ink feed inlets 2210,2211, and cover plate 2212. Also illustrated is a partition 2217 between ink liquid rooms 228,229.

FIG. 6 illustrates a head unit of a piezo-jet system having first nozzle 231 made of glass, second nozzle 232 made of glass, cylindrical piezo element 233, filter 234, liquid ink supply tubes 235,236, and electric signal input terminal 237. In FIGS. 5 and 6, two nozzles are employed, but the number of the nozzles is not limited thereto.

In FIGS. 1 and 2, liquid 12 may be composed of an aqueous solution and so forth containing an element or a compound for forming the electroconductive thin film. For example, the liquid containing palladium or a compound thereof as the element or the compound for the electroconductive thin film formation includes aqueous solutions of an ethanolamine type complex such as palladium acetate-ethanolamine complex (PA-ME), palladium acetate-diethanolamine complex (PA-DE), palladium acetate-triethanolamine complex (PA-TE), palladium acetate-butylethanolamine complex (PA-BE), and palladium acetate-dimethylethanolamine complex (PA-DME); aqueous solutions of an amino acid type complex such as palladium-glycine complex (Pd-Gly), palladium-β-alanine complex (Pd-β-Ala), and palladium-DL-alanine complex (Pd-DL-Ala).

It is preferable that IPA (isopropyl alcohol) be contained in an amount of 5 to 30% by weight as a solvent component of the aqueous solution (ink) to adjust the surface tension of the ink within a range of from 30 to 50 dyn/cm. It is also preferable that respective initial contact angles of the ink with a material for the electrodes and a material for the substrate fall within a range of from 20° to 50°, and that a difference in initial contact angle with the ink between the materials for the electrodes and substrate be within 30°.

FIG. 2 illustrates an example where IPA is used as a solvent component of the aqueous solution to control the surface tension of the organic metal-containing aqueous solution. As illustrated in FIG. 2, the surface tension of the aqueous solution can be controlled by mixing IPA to adjust it within the preferable range of from 30 to 50 dyn/cm.

On the other hand, the surface energy of the substrate material and element electrode material is adjusted in the following manner. After the element electrodes are formed on the substrate, the substrate is fully washed. Alternatively, after the substrate is coated with a titanium oxide film, and the element electrodes are formed thereon, the thus-treated substrate is exposed to light. In this manner, a hydrophilic surface is evenly formed on the substrate and electrodes. When such a substrate is left to stand in an environment under control, a water-repellent surface is formed with time, so that the above-described contact angle is saturated at a preferable value within a range of from 20° to 50°. Thus, the surface energy of both substrate and electrode material reaches a saturated value. Therefore, the surface energy becomes even and stable even when a large-size substrate is used and it takes a long time to apply the droplets.

The organic metal-containing droplets applied to the substrate in such a manner are thermally decomposed by calcination, thereby forming the electroconductive thin film.

Here, the term "environment under control" means an environment in which a desired concentration of an organic substance is present.

In the present invention, the above environment is produced in the following manner.

(1) After the substrate is placed in a chamber, and the chamber is charged with dry nitrogen or the like to purge the chamber, an organic gas suitably diluted with nitrogen gas is charged into the chamber, and the substrate is left to stand until the surface energy of the substrate is saturated. The standing time is suitably determined according to the organic substance charged. This step is not limited by this process, and may be conducted in the following manner. After the substrate is placed in the chamber, and the chamber is evacuated, the organic gas is charged into the chamber under a proper partial pressure, and the substrate is left to stand until the surface energy of the substrate is saturated. According to this step, the organic substance adheres to the surface of the substrate, whereby the surface condition of the substrate is changed to a water-repellent surface.

Preferred organic substances used in the present invention are aliphatic and aromatic organic substances which do not depend on polarity and have no hydrophilic group and elimination energy of at least 20 Kcal/mol. For example, di-2-ethylhexyl phthalate is preferably used.

(2) The substrate is stored in a desiccator. When the substrate is stored in the desiccator, the concentration of organic substances in the atmosphere becomes more constant than when stored in an ordinary room. When the substrate is stored in the desiccator, the contact angle of the substrate with the droplet is increased with time. This is considered to be attributable to the fact that organic substances present in the atmosphere in the desiccator are adsorbed on the substrate, whereby the surface energy of the substrate is gradually lowered (to form a water-repellent surface). It is also considered that when the substrate is placed in the desiccator in which the humidity is controlled low, the amount of water adsorbed on the substrate is decreased, and so the adsorption of the organic substance is facilitated, resulting in a rise in the contact angle of the substrate.

When the substrate is stored in such a desiccator in the present invention, it is preferable that the humidity be controlled to 20% or lower.

As described above, the principal object of leaving the substrate to stand under the environment in which the predetermined concentration of the organic substance is present is to adhere the organic substance to the surfaces of the substrate and element electrodes. Therefore, the following method may also be preferably used in the present invention. Namely, a hydrophobic agent such as a silane coupling agent is adhered to the surface of the substrate. More specifically, the substrate is placed in a container in which the vapor of the silane coupling agent has been saturated. In addition, a method of blowing nitrogen or the like saturated with the silane coupling agent against the substrate is included. The method for the adhesion is not limited to the above methods only. The substrate may be immersed in a solution diluted with an organic solvent such as ethanol. Alternatively, such a solution may be sprayed or coated.

And then, the substrate to which the silane coupling agent had been adhering was heat-treated or was left, to make the substrate combine with silicon Si on the surface of the glass in the form of (Si—O—Si). As the result, a coat adhering strongly on the glass surface and having the water repellent was formed.

A particular feature of the production process of the present invention resides in that the above-described adjustment of the surface energy of the substrate, on which the element electrodes have been formed, is conducted prior to the application of the droplets of the desired aqueous solution to the substrate.

The production process of a surface conduction type electron-emitting element using the electroconductive thin film formed in the above described manner will hereinafter be described.

Electroconductive thin film 4 thus formed is subjected to a forming treatment. For example, the forming treatment is conducted by an energization forming treatment such that electric current is allowed to flow between element electrodes 2,3 from a power source not shown in the drawing to modify the structure in the portion of electroconductive thin film 4 to form the electron-emitting portion.

The energization forming causes local structure change, such as destruction, deformation, and modification, of electroconductive thin film 4. This changed site constitutes electron-emitting portion 5.

Figure 7A:
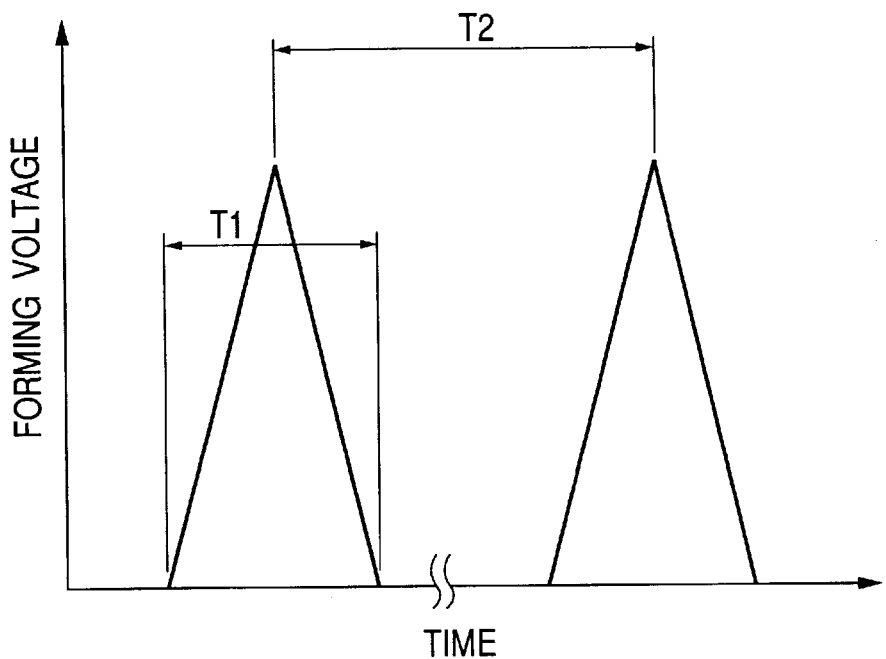
FIGS. 7A and 7B schematically illustrate examples of the waveform of voltage in a energization forming treatment which can be used in the production of a surface conduction type electron-emitting element according to the present invention.
Figure 7B:
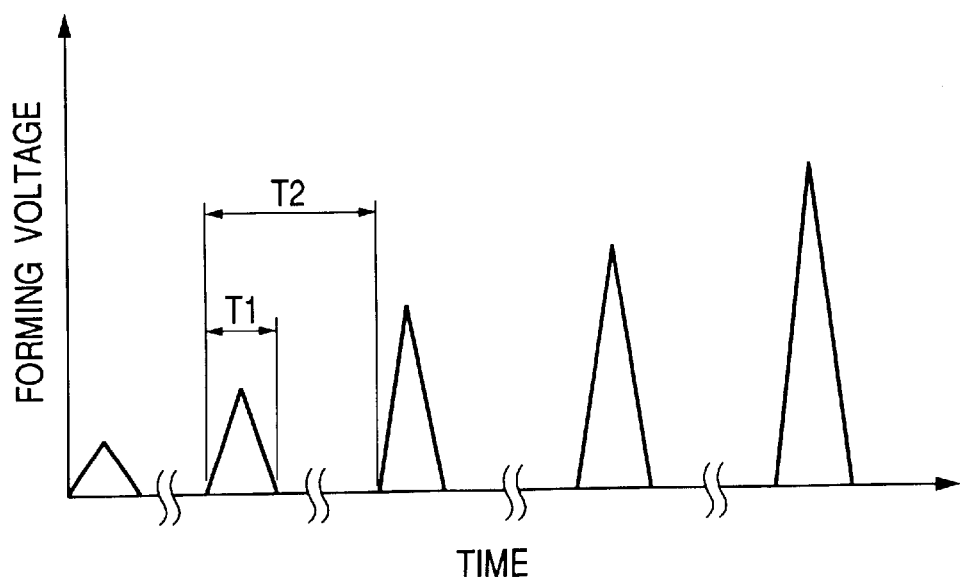

FIG. 7A and FIG. 7B show examples of the voltage wave form for the energization forming. The voltage wave is preferably in a pulse wave form, including a pulse of a constant height voltage continuously applied as shown in FIG. 7A and a pulse of increasing voltage as shown in FIG. 7B.

In FIG. 7A, T1 indicates a pulse width, and T2 indicates a pulse interval of the voltage wave form. Usually T1 is selected within the range from 1 μsec to 10 msec, and T2, from 10 μsec to 100 msec. The wave height of the triangle wave (peak voltage in energization forming) is selected suitably in correspondence with the shape of the surface conduction type electron-emitting element. Under such conditions, the voltage is applied for a time ranging from several seconds to several ten minutes. The pulse wave form is not limited to the triangle wave, but may be any desired wave form such as a rectangular wave.

In FIG. 7B, T1 and T2 may be similar to those in FIG. 7A. The wave height (peak voltage in energization forming) may be increased, for example, by about 0.1 volt per step.

The completion of the energization forming can be detected by applying a voltage not to break or not to deform locally electroconductive thin film 4 in the pulse interval T2 and measuring the current intensity. For example, the energization forming is stopped when the resistance becomes 1 MΩ or more as measured by element current at application of a voltage of about 0.1 V.

The element after the forming treatment is preferably treated for activation. The activation treatment changes remarkably element current (If) and emitting current (Ie).

The activation treatment is conducted, for example, by repeated pulse application as in the energization forming in a gas atmosphere containing an organic substance. The organic substance-containing gas atmosphere can be formed, for example, by evacuating a vacuum chamber by an oil diffusion pump or a rotary pump and utilizing a remaining organic gas, or by evacuating sufficiently a vacuum chamber by an ion pump or the like and introducing a suitable organic substance gas into the vacuum. The pressure of the organic substance gas is decided depending on the type of practical use as mentioned before, the shape of the vacuum chamber, the kind of the organic substance, and so forth. Suitable organic substances include aliphatic hydrocarbons such as alkanes alkenes, and alkynes; aromatic hydrocarbons; alcohols; aldehydes; ketones; amines; phenols; and organic acids such as carboxylic acid, and sulfonic acid. Specific examples thereof include saturated hydrocarbons represented by $C_nH_{2n+2}$ such as methane, ethane, and propane; unsaturated hydrocarbons represented by $C_nH_{2n}$ such as ethylene, and propylene; benzene; toluene; methanol; ethanol; formaldehyde; acetaldehyde; acetone; methyl ethyl ketone; methylamine; ethylamine; phenol; formic acid; acetic acid; propionic acid; and the like. By this treatment, carbon or a carbon compound deposits from the organic substance in the atmosphere onto the element to change remarkably element current If and emission current Ie. The pulse width, the pulse interval, the pulse wave height, and so forth are suitably decided.

The completion of the activation treatment is detected by measurement of element current If and emission current Ie.

The aforementioned carbon or the organic compound includes graphite (monocrystalline or polycrystalline), amorphous carbon (simple amorphous carbon, or a mixture of amorphous carbon and fine crystals of the above graphite). The film thickness of the deposit is preferably not more than 500 Å, more preferably not more than 300 Å.

The electron-emitting element after the activation treatment is preferably further treated for stabilization. The stabilization treatment is conducted in a vacuum chamber having a partial pressure of an organic substance of not higher than $1\times10^{-8}$ Torr, preferably not higher than $1\times10^{-10}$ Torr. The pressure in the vacuum chamber ranges preferably from $1\times10^{-6.5}$ to $10^{-7}$ Torr, more preferably not higher than $1\times10^{-8}$ Torr. The vacuum apparatus for evacuating the vacuum chamber is preferably oilless in order to avoid adverse effects of an oil on the characteristics of the element. Specifically the vacuum apparatus includes sorption pumps, and ion pumps. In evacuation, the vacuum chamber is heated entirely to facilitate evacuation of adsorbed organic substance molecules on the vacuum chamber wall and the electron-emitting element. The evacuation under heating is preferably conducted at a temperature ranging from 80 to 200° C. for 5 hours or longer, but is not limited thereto. The evacuation conditions are selected suitably in consideration of the size of the vacuum chamber, the constitution of the electron-emitting element, and so forth. Incidentally, the partial pressure of the above organic substance is detected with a mass spectrometer by measuring the partial pressures of the organic molecules of mass number of 10–200 mainly composed of carbon and hydrogen and integrating the partial pressures.

After the stabilization treatment, in practical drive, the atmosphere of the stabilization treatment is preferably maintained, but is not limited thereto. By sufficient removal of the organic substance, the characteristics of the element can be maintained stably even if the vacuum degree decreases slightly. Such a vacuum atmosphere prevents additional deposition of carbon or a carbon compound, giving stabilization of element current If and emission current Ie.

The image-forming apparatus of the present invention is described below. In the image-forming apparatus, the electron-emitting element may be arranged in various manners on the electron source substrate.

In one arrangement, many electron-emitting elements arranged in parallel are connected at the respective ends. Such an arrangement of the electron-emitting elements are placed in parallel lines (in the row direction). Above this wiring, control electrodes (called also grids) are provided in a direction perpendicular to the above wiring (in the column direction) to form a ladder-like arrangement to control the electrons from the electron-emitting elements.

In another arrangement, electron-emitting elements are arranged in an X direction and Y direction in a matrix, and electrodes of one side of the respective electron-emitting elements are connected commonly in the X direction, and electrodes of another side are connected commonly in the Y direction. Such a type of arrangement is a simple matrix arrangement, and is described below in detail.

Figure 8:
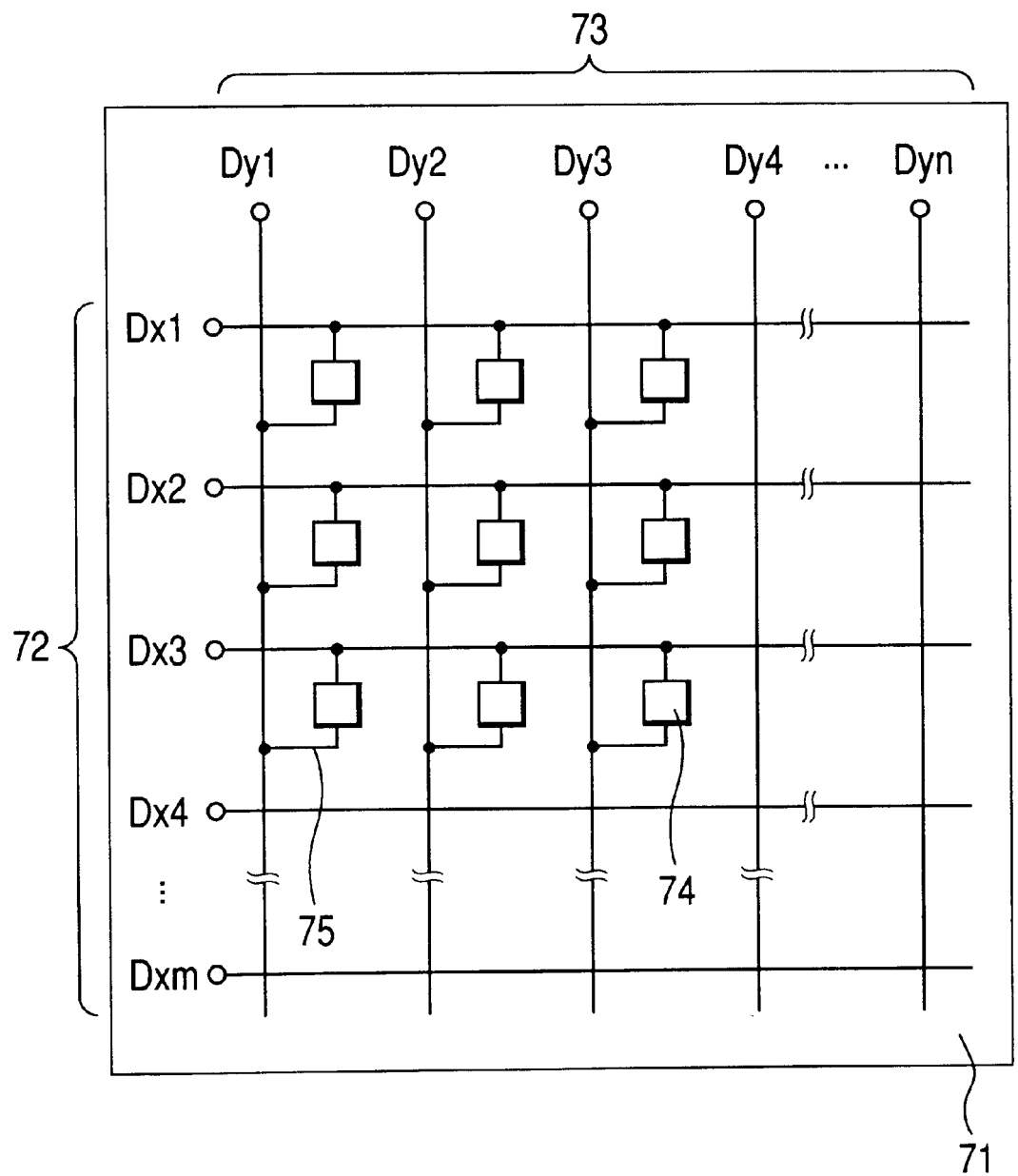
FIG. 8 schematically illustrates an electron source substrate of a matrix arrangement, to which the present invention is applied.

The substrate having electron-emitting elements arranged in a matrix of the present invention is explained by reference to FIG. 8. In FIG. 8, the numeral 71 indicates an electron source substrate, 72 an X-direction wiring, 73 a Y-direction wiring, 74 a surface conduction type electron-emitting element, and 75 a wiring.

X-Direction wiring 72 comprises m lines of wiring Dx1, Dx2, . . . , Dxm, which can be constituted of an electroconductive metal or the like. The material, the layer thickness, and the breadth of the wiring are suitably decided. Y-Direction wiring 73 comprises n lines of wiring Dy1, Dy2, . . . , Dyn, which is formed in the same manner as X-direction wiring 72. Between X-direction wiring 72 in m lines and Y-direction wiring 73 in n lines, is provided an insulating interlayer not shown in the drawing to isolate both electrically. (The symbols m and n are respectively an integer.)

The insulating interlayer not shown in the drawing is constituted of $SiO_2$ or the like. For example, the insulating interlayer is provided on the entire or a part of the surface of substrate 71 having X-direction wiring 72. The thickness, the material, and the formation process of the insulating interlayer are selected to withstand the potential difference at the intersecting points of X-direction wiring 72 and Y-direction wiring 73. X-Direction wiring 72 and Y-direction wiring 73 are respectively led out as external terminals.

A pair of electrodes (not shown in the drawing) constituting electron-emitting element 74 are connected electrically by m lines of X-direction wiring 72, n lines of Y-direction wiring 73, and connecting lines 75.

The chemical elements constituting the material for wiring 72 and wiring 73, the material for connecting lines 75, and the material for the element electrode pairs may be entirely the same, or may be different partly from each other. The materials may be selected, for example, suitably from the materials mentioned before for the element electrodes. When the material for the wiring is the same as the one of the element electrodes, the wiring connected to the element electrode may be called an element electrode.

To X-direction wiring 72, is connected a scanning signal applying means (not shown in the drawing) to apply scanning signals for selecting the line of the electron-emitting elements 74 in the X direction. To Y-direction wiring 73, is connected a modulation signal generating means (not shown in the drawing) to modulate the respective lines of electron-emitting elements 74 in the Y direction in accordance with input signals. The driving voltage for the respective electron-emitting elements is supplied as the voltage difference between the scanning signals and the modulation signals.

In the above constitution, an individual element can be selected and driven independently by use of the simple matrix wiring.

Figure 9:
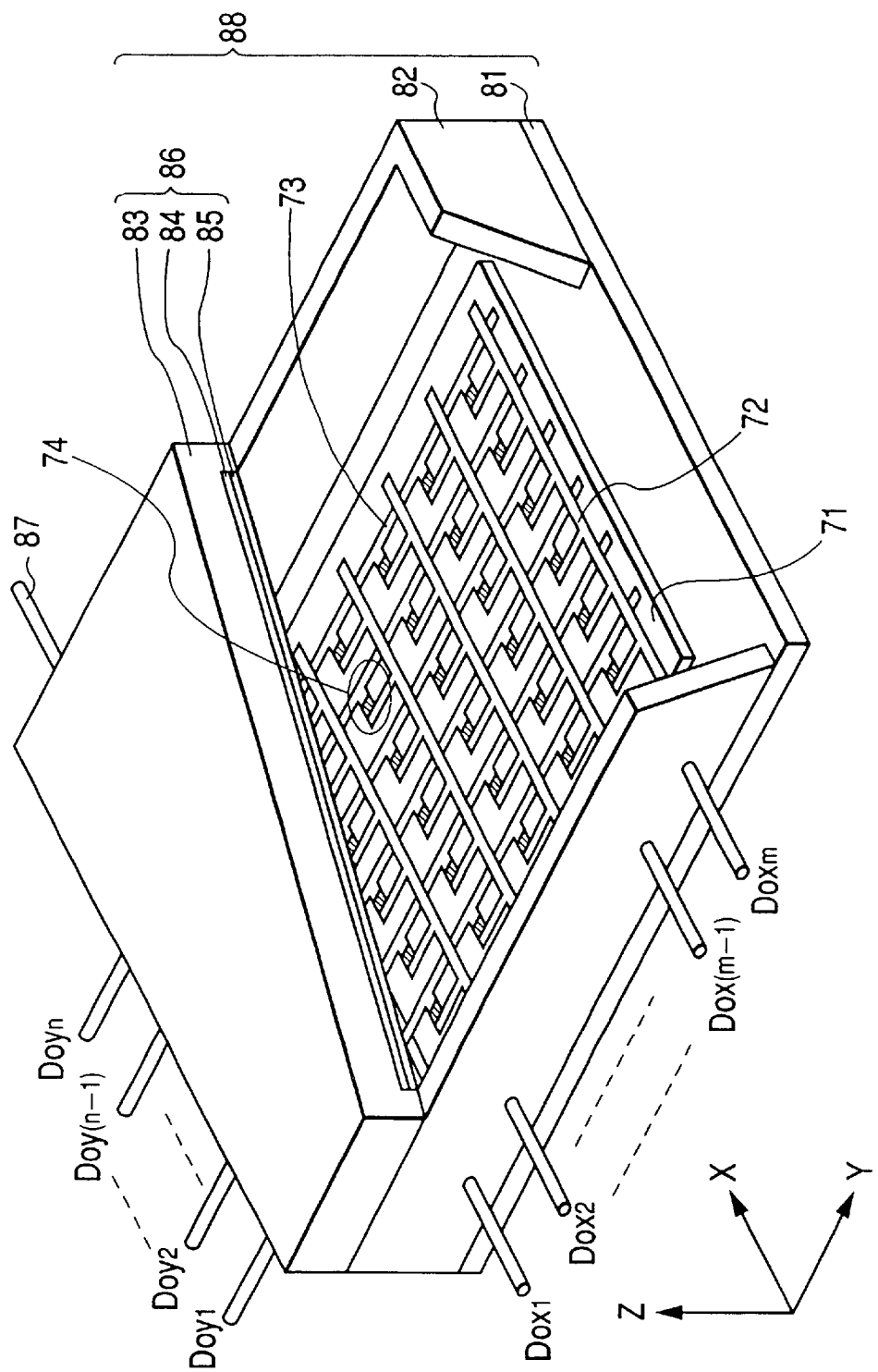
FIG. 9 schematically illustrates a matrix wiring type display panel of an image-forming apparatus, to which the present invention is applied.
Figure 10A:
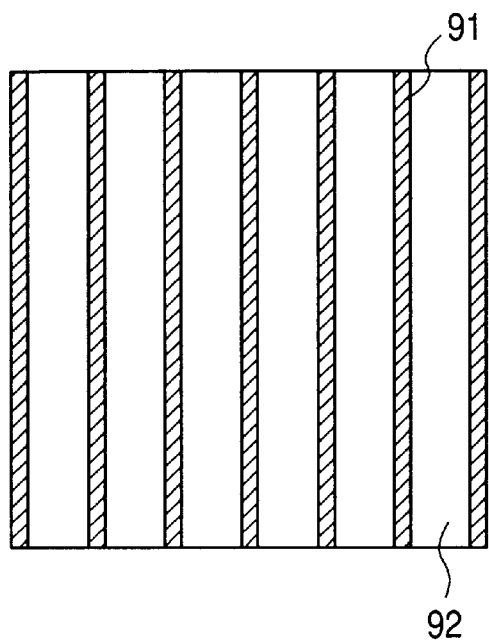
FIGS. 10A and 10B schematically illustrate an example of a phosphor film used in an image-forming apparatus.
Figure 10B:
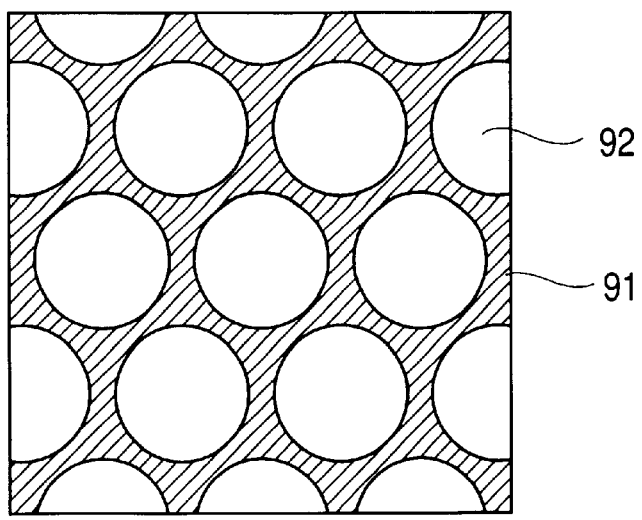
Figure 11:
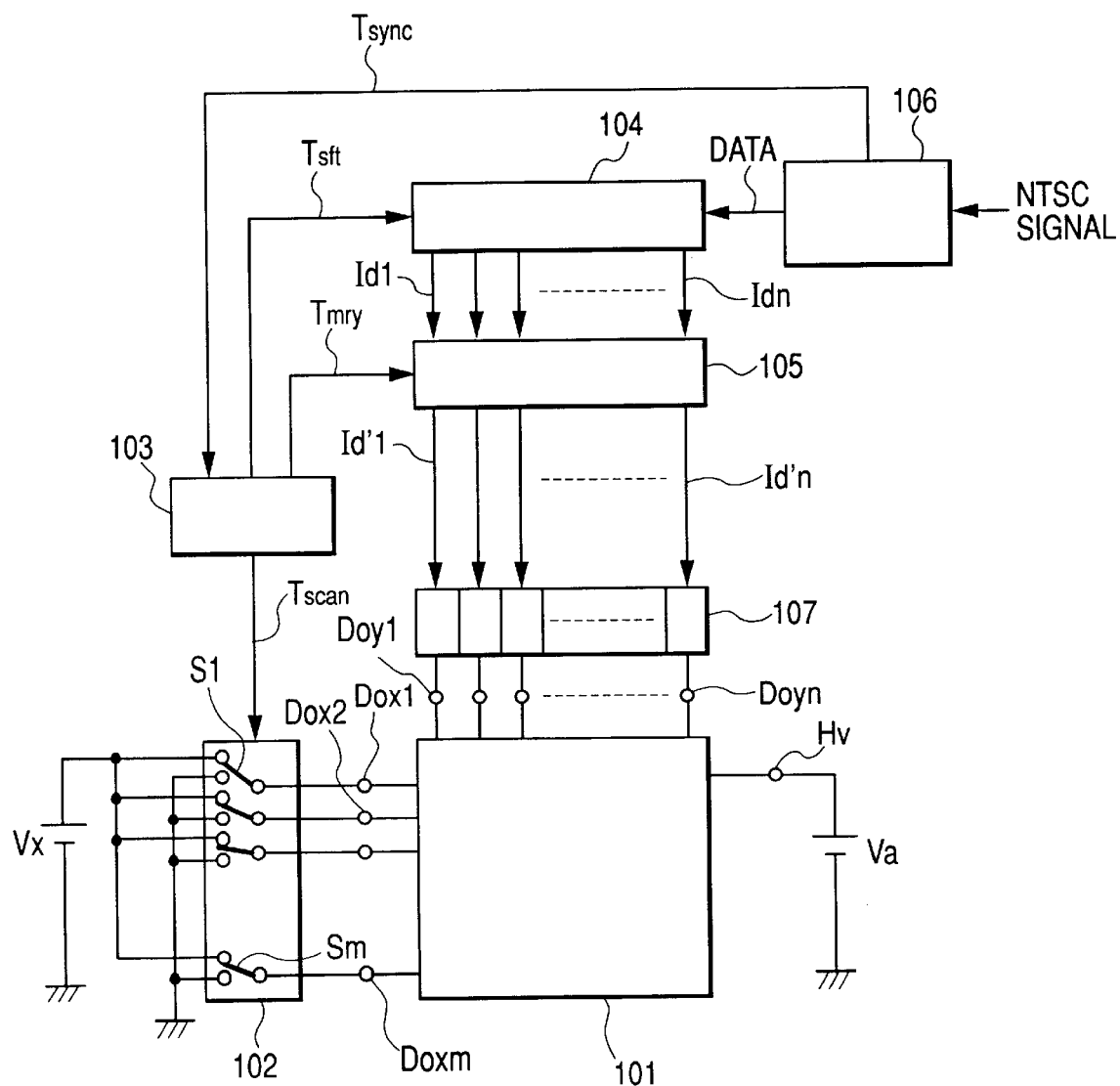
FIG. 11 is a block diagram illustrating an example of a driving circuit for a television display based on television signals of the NTSC system in an image-forming apparatus produced by the process of the present invention.

An image-forming device constructed with an electron source substrate of a simple matrix arrangement is explained by reference to FIGS. 9, 10A, 10B and 11. FIG. 9 illustrates schematically an example of the display panel of an image-forming apparatus. FIGS. 10A and 10B illustrate schematically a phosphor film employed in the display panel of FIG. 9. FIG. 11 is a block diagram of an example of a driving circuit for display in correspondence with NTSC type television signals.

In FIG. 9, electron-emitting elements are arranged on substrate 71. Rear plate 81 fixes substrate 71. Face plate 86 is constituted of glass substrate 83 having phosphor film 84, metal back 85, and so forth on the inside face. Rear plate 81 and face plate 86 are bonded to supporting frame 82 by frit glass or the like. Enclosure 88 is fusion-sealed by firing, for example, in the air or a nitrogen atmosphere at 400–500° C. for more than 10 minutes.

Surface conduction type electron-emitting element 74 corresponds to the one element shown in FIGS. 4A and 4B. X-Direction wiring 72 and Y-direction wiring 73 are connected to the pairs of element electrodes of the surface conduction type electron-emitting elements.

Enclosure 88 is constituted of face plate 86, supporting frame 82, and rear plate 81 mentioned above. Since rear plate 81 is provided mainly for increasing the strength of substrate 71, separate rear plate 81 may be omitted if electron source substrate 71 itself has sufficient strength. That is, supporting frame 82 may be bonded directly to substrate 71, and face plate 86, supporting frame 82, and substrate 71 may constitute enclosure 88. On the other hand, between face plate 86 and rear plate 81, a supporting member called a spacer (atmospheric pressure resisting member) not shown in the drawing may be provided to give enclosure 88 a sufficient strength against the atmospheric pressure.

FIGS. 10A and 10B illustrate schematically a fluorescent film. A monochromatic fluorescent film may be constituted of a phosphor only. A color fluorescent film can be constituted of a black member 91 called black stripes (FIG. 10A) or a black matrix (FIG. 10B), and phosphors 92 depending on the arrangement of the phosphor. The black stripes or the black matrix is provided for the purpose of blackening the borders between the phosphors 92 of three primary colors necessary for color display to make less remarkable the color mixing and to prevent drop of the contrast owing to external light reflection. The black stripes or the black matrix is made from a material showing less light transmittance or less reflection such as those mainly composed of graphite.

The phosphor can be applied onto glass substrate 83 by a precipitation method or a printing method either for monochrome or for multiple color. Usually metal back 85 is provided on the inside face of fluorescent film 84. The metal back is provided for the purpose of reflecting the light emitted inside by the phosphor toward the side of face plate 86 to improve the luminance, for serving as an electrode for applying an electron beam acceleration voltage, and for protecting the phosphor from damage caused by collision of negative ions generated within the enclosure. The metal back is prepared, after formation of the fluorescent film, by smoothening the inside surface of the fluorescent film (usually called "filming") and depositing Al thereon by vacuum deposition or a like method.

Further in face plate 86, a transparent electrode (not shown in the drawing) may be provided on the outside face of fluorescent film 84 (the side of glass substrate 83).

At the aforementioned fusion-sealing, for a color display, the color phosphors should be positionally registered to be confronted respectively with an electron-emitting element.

The image-forming apparatus shown in FIG. 9 can be produced as below.

Enclosure 88 is evacuated with suitable heating in the same manner as in the aforementioned stabilization treatment through an evacuation opening by an oilless evacuation apparatus like an ion pump and a sorption pump to a vacuum degree of about $10^{-7}$ Torr to obtain an atmosphere containing little organic matter, and is sealed. For maintaining the vacuum in enclosure 88 after the sealing, getter treatment may be conducted. In the getter treatment, a getter (not shown in the drawing) placed at a prescribed position in enclosure 88 is heated immediately before or after the sealing of enclosure 88 by resistance heating, high-frequency heating, or a like heating method to form a vapor deposition film. Usually the getter is mainly composed of Ba or the like. The vapor-deposition film maintains the vacuum degree by sorption, for example, at $10^{-5}$ to $10^{-7}$ Torr in enclosure 88.

A ladder arrangement type of electron source substrate and image-forming apparatus employing it is explained by reference to FIG. 12.

Figure 12:
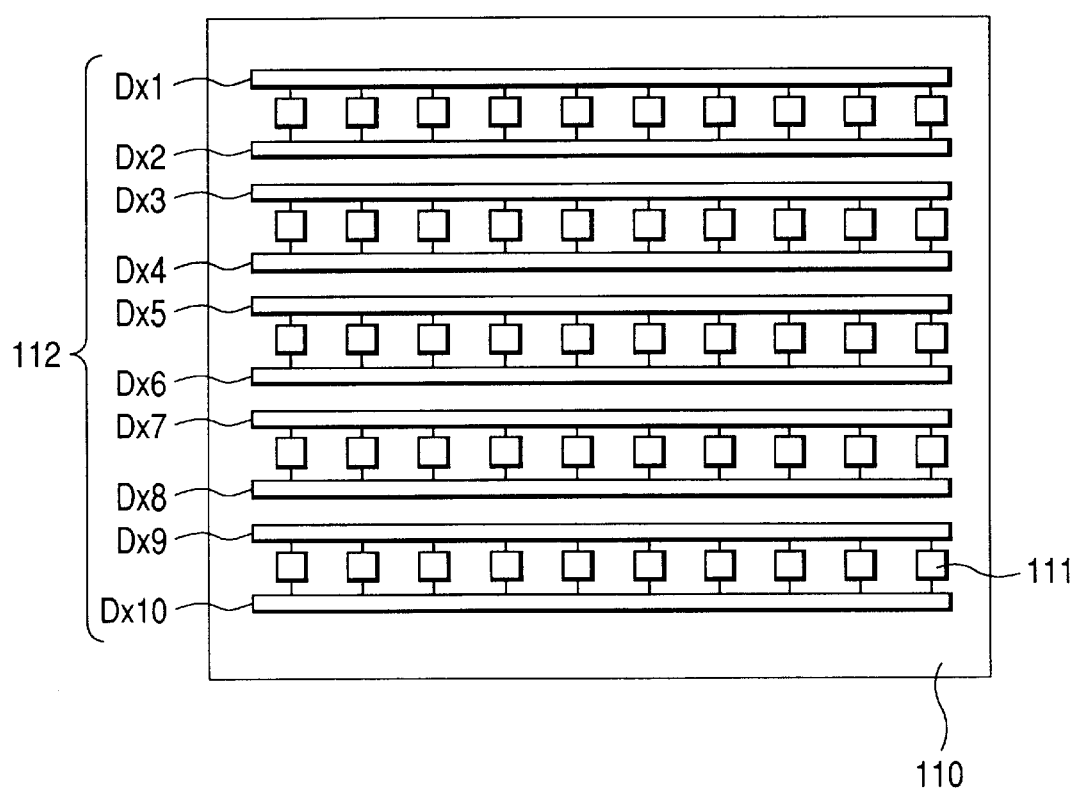
FIG. 12 schematically illustrates an electron source substrate by ladder-type wiring, to which the present invention is applied.

FIG. 12 illustrates schematically an example of the ladder type electron source substrate. In FIG. 12, the numeral 110 indicates an electron source substrate, and the numeral 111 indicates an electron-emitting element. Common wiring 112 (Dx1, . . . , Dx10) connects electron-emitting elements 111. Plural electron-emitting elements 111 are arranged in parallel in the X direction (element line). The plural element lines constitute the electron source. Each of the element lines are driven independently by application of a driving voltage: application of a voltage higher than the electron emission threshold to the element line to cause electron beam emission, and a voltage lower than the threshold to the element that does not cause the electron beam emission. Common wiring Dx2, . . . , Dx9 between the element lines, for example Dx2 and Dx3, may be of the same wiring.

The present invention will hereinafter be described in detail by the following Examples.

EXAMPLE 1

Referring to FIGS. 1, 2 and 3, a process for producing a surface conduction type electron-emitting element is described.

The surface conduction type electron-emitting element has the construction described in "DESCRIPTION OF THE PREFERRED EMBODIMENTS" and is composed of a substrate 1, element electrodes 2 and 3, and an electroconductive thin film (fine particle film) 4 like that illustrated in FIGS. 4A and 4B. In this example, an ink-jet type droplet-applying mechanism 10 is used in a method for forming the electroconductive thin film 4. FIG. 1 schematically illustrates a forming process of the electroconductive thin film 4. FIG. 2 diagrammatically illustrates the surface tensions of inks used in this example, and FIG. 3 diagrammatically illustrates the contact angle (expressed by ■ in FIG. 3) of a droplet 12 with the substrate 1 in FIG. 1 and the contact angle (expressed by ● in FIG. 3) of the droplet 12 with the element electrodes 2, 3 in FIG. 1.

General soda lime glass having a thickness of 1.8 mm was used as an insulating substrate. This glass substrate was fully washed with an organic solvent or the like and then dried in a drying oven controlled to 120° C. The element electrodes 2, 3 (electrode width: 500 μm; electrode gap: 20 μm) composed of a Pt film (film thickness: 1,000 Å) were formed on the substrate by vacuum deposition and photolithographic etching (FIG. 1). A process for forming the electroconductive thin film at a gap part between the element electrodes will hereinafter be described with reference to FIGS. 1 and 2.

As a raw solution for the droplet, an aqueous solution system was used, i.e., an aqueous solution of a palladium acetate-ethanolamine complex. The water content in the aqueous solution was at least 70% by weight. Another solvent component was isopropanol (IPA) and was contained within a range of from 5 to 25% by weight. The aqueous solution (ink) used was such that its surface tension falls within a range of from 30 to 50 dyn/cm as illustrated in FIG. 2.

The soda lime glass on which the element electrodes had been formed was fully washed with an organic solvent or the like and then dried in a drying oven controlled to 120° C. The ink containing 15% by weight of IPA was applied to a gap part between the electrodes on the substrate by means of an ink-jet head of the bubble-jet system as illustrated in FIG. 1. However, the ink run out on the glass surface at the gap part, and could not be formed into a dot. The surface energy of the substrate and electrodes at this time was such that a hydrophilic surface was formed.

Therefore, various investigations were made as to the treatment of the substrate. As a result, it was found that when the soda lime glass on which the element electrodes had been formed was subjected to ultrasonic cleaning with purified water and cleaning with hot purified water of 80° C. and lifted to dry, the ink run out on the glass surface at the gap part like the above right after the cleaning. However, when the cleaned substrate was stored in an (electric) desiccator for 48 hours after the cleaning, a dot could be stably formed between Pt of the electrode and the glass at the gap part without running of the ink.

FIG. 3 diagrammatically illustrates changes in contact angles of the surface of the soda lime glass and the surface of the Pt thin film with the ink containing 15% by weight of IPA after the cleaning with time. This graph indicates that when an initial contact angle falls within a range of from 20° to 50°, and a difference in initial contact angle between different kinds of materials (Pt and glass) is within 30°, a dot can be stably formed between Pt of the electrode and the glass at the gap part.

Under such conditions, droplets of the aqueous solution were applied four times at the gap part between the element electrodes to overlap one another. The diameter of a dot formed was about 90 μm. This state is illustrated in FIG. 1.

After the above-described step, the substrate on which the element electrodes had been formed was heated for 30 minutes in an oven controlled to 350° C. to completely remove the organic component, thereby forming an electroconductive thin film composed of fine particles of palladium oxide (PdO) on the electrodes. The diameter of the dot after the calcination was the same as that after the application of the droplets, i.e., about 90 $\mu$m, and its film thickness was 150 Å. Therefore, the element length may be said to be about 90 $\mu$m.

Voltage was applied between the element electrodes 2 and 3 between which the electroconductive thin film had been formed, to subject the electroconductive thin film to energization forming, thereby forming an electron-emitting part. In this manner, the surface conduction type electron-emitting element was completed.

The surface conduction type electron-emitting element produced by the process described in Example 1 attained the same electron emission characteristics as that produced by the conventional vacuum deposition-photolithographic etching process.

The surface tension of the inks was measured by means of a Wilhelmy type surface tension meter. The surface tension of the ink could be adjusted by changing the concentration of IPA as shown in FIG. 2.

The term "initial contact angle" as used herein means a contact angle measured within 1 minute after the ink comes into contact with the substrate surface, and such a contact angle can be directly measured by using a commercially available goniometer or the like. The amount of an ink droplet upon the measurement of the initial contact angle is preferably not more than 10 $\mu$l.

The measurement of the contact angles illustrated in FIG. 3 in this example was conducted by subjecting both the same soda lime glass substrate as that used in the formation of the element electrodes and a substrate, on which a Pt film had been formed in a thickness of 1,000 Å in the same manner as described above, to ultrasonic cleaning with purified water and cleaning with hot purified water of 80° C., lifting both substrates to dry, storing them in an (electric) desiccator controlled to a humidity of 20% or lower with the storage time varied, applying 4 $\mu$l of the same ink containing 15% by weight of IPA as described above to both substrates thus stored and measuring their contact angles with the inks after 3 seconds from the application of the ink by means of a contact angle meter, CA-X Model (trade name, manufactured by Kyowa Kaimen Kagaku K.K.).

EXAMPLE 2

A process for producing an electron source substrate having a plurality of surface conduction type electron-emitting elements according to the present invention and a process for producing an image-forming apparatus using this electron source substrate will be described. In this example, a plurality of electrodes were arranged in the form of a matrix as illustrated in FIG. 12, and the electrodes were connected to wiring in the form of a ladder. The production process of the surface conduction type electron-emitting elements is fundamentally the same as in Example 1.

A soda lime glass substrate having a thickness of 2.8 mm was used as an insulating substrate. This glass substrate was fully washed with an organic solvent or the like and then dried in a drying oven controlled to 120° C. Element electrodes 2, 3 (electrode width: 500 $\mu$m; electrode gap: 20 $\mu$m) were formed with a Pt film (film thickness: 1,000 Å) on the substrate. Ladder-type Ag wiring was connected to these electrodes (not illustrated).

As a raw solution for droplets, the same aqueous solution (ink) was used as that used in Example 1, i.e., an aqueous solution of a palladium acetate-ethanolamine complex, which contained 15% by weight of IPA. An ink-jet head of the piezo-jet system was used as a droplet-applying apparatus.

After the substrate on which the element electrodes and wiring had been formed was subjected to ultrasonic cleaning with purified water and cleaning with hot purified water of 80° C. and lifted to dry, the cleaned substrate was stored in the same (electric) desiccator as that used in Example 1 for fully two days to ensure that 48 hours elapsed. Droplets of the aqueous solution were then applied four times at each gap part between the element electrodes to overlap one another. Even in this case, the droplets were able to be stably applied in the form of a dot. The diameter of the dot was about 90 $\mu$m. After this step, the electron source substrate was heated for 30 minutes in an oven controlled to 350° C. to completely remove the organic component, thereby forming an electroconductive thin film composed of fine particles of palladium oxide (PdO) on each element electrode. The diameter of the dot after the calcination was the same as that after the application of the droplets, i.e., about 90 $\mu$m, and its film thickness was 150 Å. Therefore, the element length may be said to be about 90 $\mu$m.

Voltage was applied between the element electrodes 2 and 3 between which the electroconductive thin film had been formed, to subject the electroconductive thin film to energization forming, thereby forming an electron-emitting part. In this manner, the electron source substrate having the surface conduction type electron-emitting elements according to the ladder-type wiring was completed.

An enclosure was constituted of a face plate 86, a support frame 82 and a rear plate 81 to vacuum-seal this electron source substrate, thereby forming a display panel according to the ladder-type wiring as illustrated in FIG. 9 and to produce an image-forming apparatus having a driving circuit for television display based on television signals of the NTSC system as illustrated in FIG. 11.

The image-forming apparatus according to the ladder-type wiring of the surface conduction type electron-emitting elements produced by the process described in Example 2 provided images identical with those according to the conventional vacuum deposition-photolithographic etching process.

EXAMPLE 3

An additional process for producing an image-forming apparatus having a plurality of the surface electroconductive electron-emitting elements according to the present invention will be described. The production process of an electron source substrate for this apparatus is substantially the same as in Example 2. However, wiring by a simple matrix arrangement as shown in FIG. 8 was used as wiring for the electron source substrate in Example 3.

As with Example 2, a soda lime glass substrate having a thickness of 2.8 mm was used as an insulating substrate. This glass substrate was fully washed with an organic solvent or the like and then dried in a drying oven controlled to 120° C. Element electrodes 2, 3 (electrode width: 500 $\mu$m; electrode gap: 20 $\mu$m) were formed with a Pt film (film thickness: 1,000 Å) on the substrate. Matrix type Ag wiring was connected to these electrodes (not illustrated).

A method for forming an electroconductive thin film at a gap part between each pair of element electrodes was substantially the same as in Example 2. As a raw solution for droplets, was used the same aqueous solution (ink) as that used in Example 1, i.e., an aqueous solution of a palladium acetate-ethanolamine complex, which contained 15% by weight of IPA. An ink-jet head of the bubble-jet system was used as a droplet-applying apparatus.

After the substrate on which the element electrodes and wiring had been formed was subjected to ultrasonic cleaning with purified water and cleaning with hot purified water of 80° C. and lifted to dry, the cleaned substrate was stored in the same (electric) desiccator as that used in Example 1 for fully two days to ensure that 48 hours elapsed. Droplets of the aqueous solution were then applied four times at each gap part between the element electrodes to overlap one another, whereby the droplets were able to be stably applied in the form of a dot having a diameter of about 90 $\mu$m. After this step, the electron source substrate was heated for 30 minutes in an oven controlled to 350° C. to completely remove the organic component, thereby forming an electroconductive thin film composed of fine particles of palladium oxide (PdO) and having a film thickness of 150 Å and an element length of about 90 $\mu$m on each element electrode.

After conducting the application of droplets, drying and calcination was performed in the same procedure as in Example 2, and the electroconductive thin film was subjected to an energization forming to form an electron-emitting part. In this manner, the electron source substrate having the surface conduction type electron-emitting elements according to the matrix type wiring was completed.

An enclosure 88 was constituted of a face plate 86, a support frame 82 and a rear plate 81 to vacuum-seal this electron source substrate, thereby forming a display panel according to the matrix type wiring as illustrated in FIG. 9, and to produce an image-forming apparatus having a driving circuit for television display based on television signals of the NTSC system as illustrated in FIG. 11.

The image-forming apparatus according to the matrix type wiring of the surface conduction type electron-emitting elements produced by the process described in Example 3 provided images identical with those according to the conventional vacuum deposition-photolithographic etching process.

EXAMPLE 4

An electron-emitting element of the type illustrated in FIGS. 4A and 4B was produced as an electron-emitting element according to the present invention.

Figure 13A:
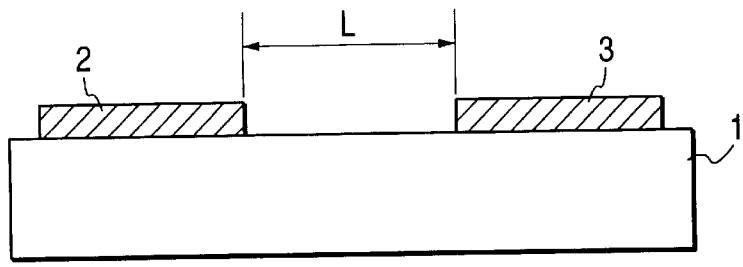
FIGS. 13A, 13B, 13C and 13D illustrate a production process according to the present invention.

Referring to FIGS. 13A to 13D, a process for producing the electron-emitting element according to this example will be described. A quartz glass substrate was used as a substrate 1. After this substrate was fully washed with an organic solvent, element electrodes 2 and 3 composed of Pt were formed on the surface of the substrate (FIG. 13A).

A gap L between the element electrodes, a length W of each element electrode and a thickness d thereof were preset to 20 $\mu$m, 500 $\mu$m and 1,000 Å, respectively.

The substrate on which the element electrodes 2, 3 had been formed was then subjected to a hydrophobicity-imparting treatment with dimethyldiethoxysilane in the following manner.

After the substrate on which the element electrodes had been formed was subjected to ultrasonic cleaning with purified water and cleaning with hot purified water of 80° C. and lifted to dry, vapor of dimethyldiethoxysilane was applied to a surface of the glass substrate, on which a film will be formed. More specifically, the substrate was placed in a container in which the vapor of dimethyl-diethoxysilane was saturated, left to stand for 1 hour at room temperature (about 22° C.) and then taken out. Subsequently, the thus-treated substrate was subjected to a heat treatment at 110° C. for 10 minutes. By this heating, Si in dimethyldiethoxysilane is bonded (by siloxane bond) to Si in the film-forming surface of the glass substrate in the form of Si—O—Si, whereby alkylsilane is strongly fixed to the film-forming surface of the glass substrate. By the above-described process, a water-repellent film having, as a hydrophobic group, a methyl group derived from dimethyldiethoxysilane is formed on the glass surface. Incidentally, the heat treatment is conducted with a view toward stabilizing the bond of the substrate to the silane coupling agent in a short period of time and has an effect to stabilize the contact angle of a droplet with the glass surface. However, even when the substrate treated with dimethyldiethoxysilane is left to stand for about a day at ordinary temperature, a stable bond may also be formed. The step of applying droplets may also be conducted without the heat treatment so far as the surface treated satisfies the desired conditions of contact angle.

Figure 14:
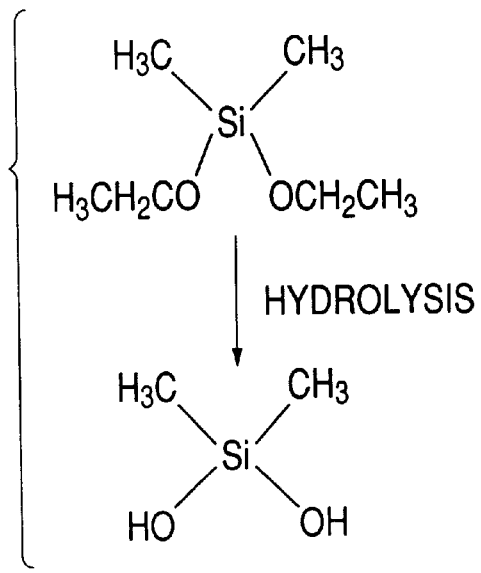
FIGS. 14, 15A and 15B, 17, 18, 19 and 20 illustrate hydrophobicity-imparting treatments in the production processes according to the present invention.
Figure 15A:
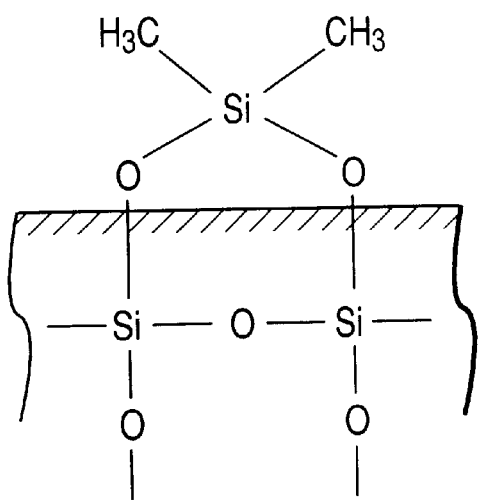
Figure 15B:
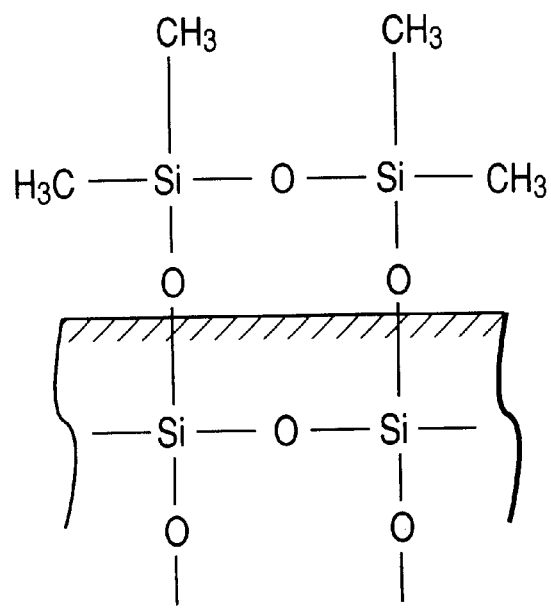

In the process of the formation of this film, it is considered that the following reactions progress. Namely, the ethoxy groups, which are hydrolyzable groups in dimethyldiethoxysilane, are hydrolyzed as illustrated in FIG. 14 to form silanol groups (—SiOH) on the side of dimethyldiethoxysilane. The silanol groups undergo condensation by dehydration with silanol groups on the side of the film-forming surface of the glass substrate, whereby Si in dimethyldiethoxysilane is bonded by siloxane bond to Si in the film-forming surface of the glass substrate as illustrated in FIG. 15. As illustrated in FIG. 15, it is also considered that one of the silanol groups is bonded by siloxane bond to Si in the film-forming surface of the glass substrate, and the other is bonded by siloxane bond to Si in adjacent dimethyldiethoxysilane.

Dimethyldiethoxysilane is a silane coupling agent having two hydrolyzable groups and is moderate in its adhesion rate to the glass surface, so that the contact angle of the glass surface with the droplet can be controlled within a range of from 20 to 50° with relative ease. Since the surface of the element electrode has no site capable of being bonded to the silanol group formed by the hydrolysis of dimethyldiethoxysilane, no product adhered by formation of the chemical bond fundamentally exists, and a product formed by mutual polymerization of dimethyldiethoxysilane only partially adheres. It is thus considered that a silane layer is not very formed on the element electrode compared with the glass surface. However, even either in the case where the surface of the element electrode is made hydrophilic by cleaning with water, or the like, or in the element electrode surface itself, its contact angle with the droplet generally becomes a value within a range of from 20 to 50° in an extremely short period of time after water on the surface is blown off. Therefore, a practical problem is scarcely caused even when no layer of the silane coupling agent is formed.

In this example, as a material for forming an electroconductive thin film, an aqueous solution was used, which was obtained by dissolving tetramonoethanolamine-palladium acetate [Pd(NH$_2$CH$_2$CH$_2$OH)$_4$(CH$_3$COO)$_2$] in an aqueous solution containing 0.05% by weight of polyvinyl alcohol, 15% by weight of 2-propanol and 1% by weight of ethylene glycol so as to give a palladium concentration of about 0.15% by weight.

Figure 13B:
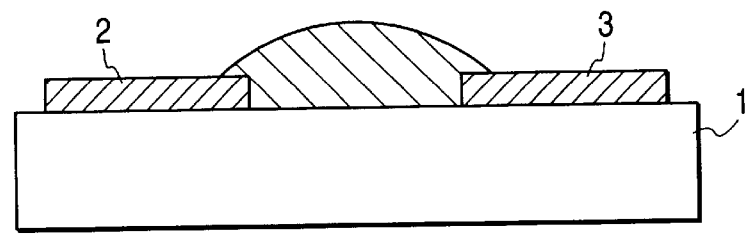

Droplets of the above-described aqueous solution (ink) were applied by an ink-jet apparatus (using a bubble-jet printer head, BC-01 manufactured by Canon Inc.) of the bubble-jet system onto the quartz glass substrate, on which the electrodes 2, 3 had been formed, so as to extend over the electrodes 2 and 3 (FIG. 13B).

Figure 13C:
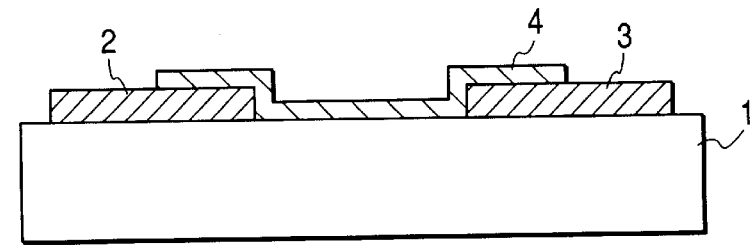

At this time, the form of the droplet on the substrate was good in both stability and reproducibility without spreading. The substrate was then calcined at 350° C. for 20 minutes to form an electroconductive thin film 4 (FIG. 13C).

In such a manner, 10 elements were produced. The film thickness of the electroconductive thin film in each element was measured through an atomic force microscope. As a result, the film thickness was 15 nm on the average, and a scatter of film thickness among the ten elements was 5%. A resistance between the element electrodes was 2.5 kΩ on the average, and a scatter of resistance among the ten elements was ±90 Ω. The initial contact angles of the droplet with the glass surface was measured by means of a contact angle meter (CA-X Model, trade name, manufactured by Kyowa Kaimen Kagaku K.K.) and was found to be 42°, and a scatter of initial contact angle among the ten elements was ±3°.

Figure 13D:
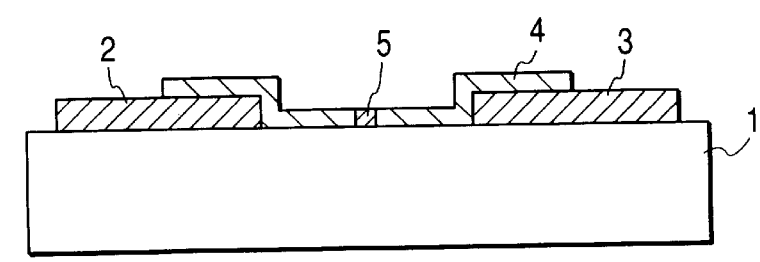

Voltage was then applied between the element electrodes 2 and 3 in a vacuum container to subject the electroconductive thin film 4 to an energization forming, thereby forming an electron-emitting part 5 (FIG. 13D). The voltage waveform upon the energization forming treatment is illustrated in FIG. 7B.

In this example, a pulse width T1 and a pulse spacing T2 of the voltage waveform was preset to 1 millisecond and 10 milliseconds, respectively. The peak value (peak voltage upon forming) of the chopping wave is gradually increased to conduct the energization forming treatment in a vacuum atmosphere of about $1 \times 10^{-8}$ Torr.

The elements produced in the above-described manner were subjected to an activating treatment by applying voltage between the element electrodes for about 40 minutes in an atmosphere in which about $1 \times 10^{-5}$ Torr of acetone was introduced. The activating treatment was conducted by using the same voltage waveform (FIG. 7A) as in the energization forming treatment and presetting the peak value of the chopping wave to 14 V. Thereafter, evacuation was conducted to about $1 \times 10^{-8}$ Torr.

Figure 16:
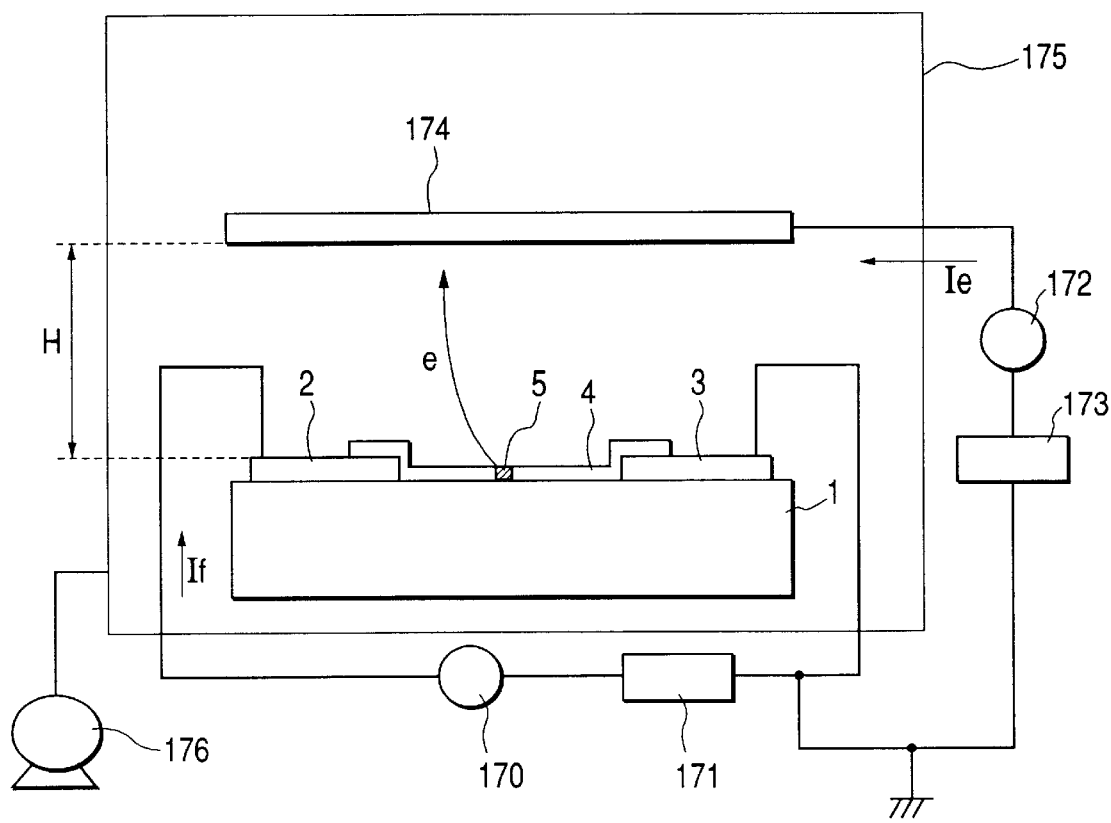
FIG. 16 illustrates an apparatus for evaluating electron emission characteristics of an electron-emitting element.

With respect to the elements produced in the above-described manner, the electron emission characteristics were determined by means of a measuring and evaluating apparatus illustrated in FIG. 16. The electron-emitting element and an anode 174 are arranged in a vacuum equipment 175, and the vacuum equipment is equipped with necessary instruments for the vacuum equipment, such as a vacuum pump 176 and a vacuum gage (not illustrated), so that the measurement and evaluation of the electron-emitting element can be conducted under the desired vacuum. Incidentally, in this example, a distance H between the anode and the electron-emitting element, a potential of the anode and a degree of vacuum in the vacuum equipment upon the determination of the electron emission characteristics were preset to 4 mm, 1 kV and $1 \times 10^{-8}$ Torr, respectively.

The measuring and evaluating apparatus as described above was used, and element voltage was applied between the electrodes 2 and 3 of the electron-emitting element to measure an element current If and an emission current Ie which flow at that time. In the element according to this example, the emission current rapidly increases from the element voltage of about 7 V. At the element voltage of 14 V, the element current If reached 2.0 mA, while the emission current Ie amounted to 3.0 µA.

In the example described above, upon the formation of the electron-emitting part, chopping wave pulses were applied between the element electrodes to conduct the energization forming treatment. However, the waveform applied between the element electrodes is not limited to the chopping wave, and any desired waveform such as a rectangular wave may be used. The peak value, pulse width and pulse spacing thereof are also not limited to the above-described values, and any desired values may be selected so far as the electron-emitting part is satisfactorily formed.

EXAMPLE 5

Droplets of the aqueous solution were applied in exactly the same manner as in Example 4 except that dimethyldichlorosilane was used as an agent for the hydrophobicity-imparting treatment, and an electron-emitting element was produced in the same manner as in Example 4. As a result, the dot form of the droplet was similarly stable without spreading beyond the desired position, reproducibility was also good, and a scatter of film thickness among elements was also narrow.

EXAMPLE 6

A substrate (FIG. 8), on which 256 element electrodes in total of 16 rows and 16 columns and matrix type wiring had been formed, was subjected to a hydrophobicity-imparting treatment, and droplets of the aqueous solution were applied by the ink-jet apparatus (using a bubble-jet printer head, BC-01 manufactured by Canon Inc.) of the bubble-jet system between each pair of element electrodes on the substrate in the same manner as in Example 4. The thus-treated substrate was calcined and then subjected to energization forming and activating treatments in the same manner as in Example 4, thereby producing an electron source substrate.

A rear plate 81, a support frame 82 and a face plate 86 were connected to this electron source substrate to vacuum-seal the electron source substrate, thereby producing an image-forming apparatus as illustrated in FIG. 9.

In the image-forming apparatus produced in such a manner, electron emission characteristics become even since the dot form of the droplet was stable without spreading beyond the desired position. Therefore, good images having few defects such as luminance irregularity were able to be provided with good reproducibility. Since patterning and the like for the formation of the electroconductive thin film were unnecessary, its production process could be simplified, and so its production cost could be reduced.

REFERENTIAL EXAMPLE 1

Droplets of the ink were applied onto a substrate, on which element electrodes had been formed, in exactly the same manner as in Example 4 except that the substrate was used immediately without conducting the treatment with dimethyldiethoxysilane after it was subjected to ultrasonic cleaning with purified water and cleaning with hot purified water of 80° C. and lifted to dry. In such a manner, 10 elements were produced. Upon the application of the ink, the droplet spread beyond the desired position. The film thickness of the electroconductive thin film after the calcination was measured through an atomic force microscope. As a result, the film thickness was 4 nm on an average of the ten elements and thinner than a half of the film thickness in Example 4. A scatter of film thickness among the ten elements was 35%. The resistance value thereof was also increased. These results are shown in Table 1 together with the results of Example 4.

TABLE 1

| | Film thickness | Scatter of film thickness | Contact angle | Scatter of contact angle | Resistance value | Scatter of Resistance |
|---|---|---|---|---|---|---|
| Ex. 4 | 15 nm | 5% | 42° | ±3° | 2.5 kΩ | ±90Ω |
| Ref. Ex. 1 | 4 nm | 35% | 5° | ±3° | 15 kΩ | ±7k Ω |

As described above, the hydrophobicity-imparting treatment of the film-forming surface of the substrate permits preventing the droplet from spreading, controlling the contact angle of the droplet with the film-forming surface of the substrate within the range of from 20 to 50° and so forming an electroconductive thin film narrow in scatter of film thickness and good in both stability and reproducibility.

EXAMPLE 7

An electron-emitting element of the type illustrated in FIGS. 4A and 4B was produced as an electron-emitting element according to the present invention.

Referring to FIGS. 13A to 13D, a process for producing the electron-emitting element according to this example will be described. A quartz glass substrate was used as a substrate 1. After this substrate was fully washed with an organic solvent, element electrodes 2 and 3 composed of Pt were formed on the surface of the substrate (FIG. 13A).

A gap L between the element electrodes, a length W of each element electrode and a thickness d thereof were preset to 20 μm, 500 μm and 1,000 Å, respectively.

The substrate on which the element electrodes 2, 3 had been formed was then subjected to a hydrophobicity-imparting treatment with trimethylethoxysilane represented by the following chemical formula in the following manner.

$(CH_3)_3SiOCH_2CH_3$

After the substrate on which the element electrodes had been formed was subjected to ultrasonic cleaning with purified water and cleaning with hot purified water of 80° C. and lifted to dry, vapor of trimethylethoxysilane was applied to a surface of the glass substrate, on which a film will be formed. More specifically, the substrate was placed in a container in which the vapor of trimethylethoxysilane was saturated, left to stand for 8 hours at room temperature (about 22° C.) and then taken out. Subsequently, the thus-treated substrate was subjected to a heat treatment at 110° C. for 10 minutes to enhance the stability of a film formed. By this heating, Si in trimethylethoxysilane is bonded (by siloxane bond) to Si in the film-forming surface of the glass substrate in the form of Si—O—Si, whereby alkylsilane is strongly fixed to the film-forming surface of the glass substrate. By the above-described process, a water-repellent film having, as a hydrophobic group, a methyl group derived from trimethylethoxysilane is formed on the glass surface. Incidentally, the heat treatment is conducted with a view toward stabilizing the bond of the substrate to the silane coupling agent in a short period of time and has an effect to stabilize the contact angle of a droplet with the glass surface. However, even when the substrate treated with trimethylethoxysilane is left to stand for about a day at ordinary temperature, a stable bond may also be formed. The step of applying droplets may also be conducted without the heat treatment so far as the surface treated satisfies the desired conditions of contact angle.

Figure 17:
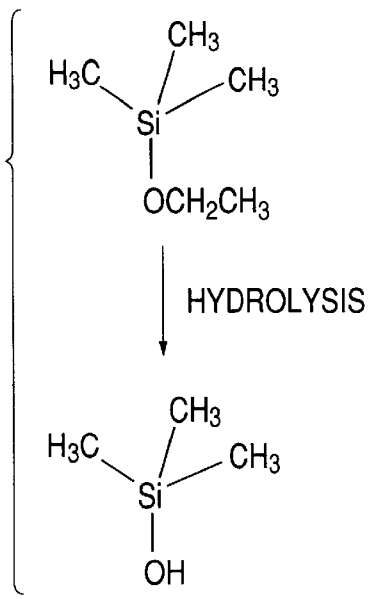
Figure 18:
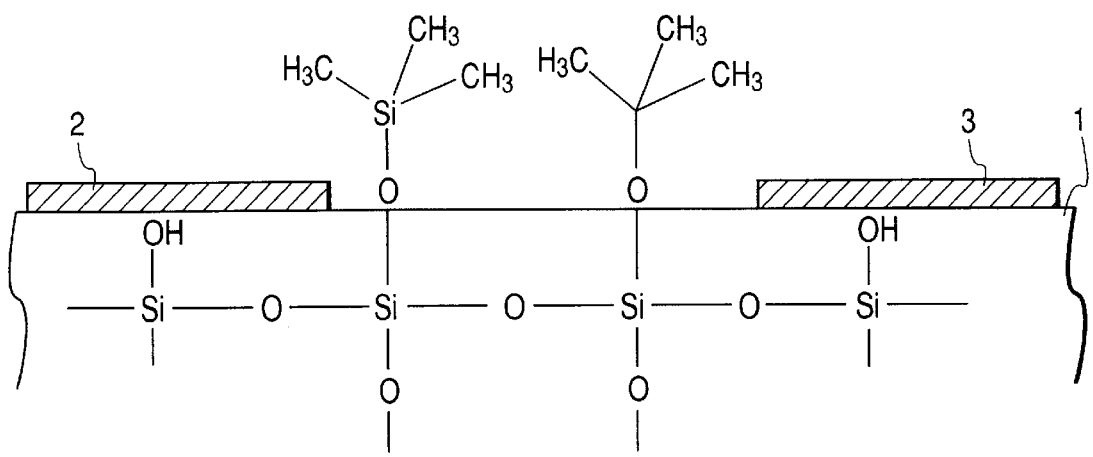

In the process of the formation of this film, it is considered that the following reactions progress. Namely, the ethoxy group, which is a hydrolyzable group in trimethylethoxysilane, is hydrolyzed by moisture in the air or absorbed water in the glass as illustrated in FIG. 17 to form a silanol group (—SiOH) on the side of trimethylethoxysilane. The silanol group undergoes condensation by dehydration with a silanol group on the side of the film-forming surface of the glass substrate, whereby Si in trimethylethoxysilane is bonded by siloxane bond to Si in the film-forming surface of the glass substrate as illustrated in FIG. 18.

Since trimethylethoxysilane is a silane coupling agent having only one hydrolyzable group, the silanol group for being bonded to the substrate is lost when the silane coupling agent undergoes mutual polymerization. Therefore, a complete or incomplete silane layer is formed on the glass surface with ease, so that the contact angle of the glass surface with the droplet can be easily controlled within a range of from 20 to 50° without raising the contact angle too high. Since the surface of the element electrode has no site capable of being bonded to the silanol group formed by the hydrolysis of trimethylethoxysilane, and this silane coupling agent is a silane coupling agent having only one hydrolyzable group, and so any product higher than a dimer is not formed even when the silane coupling agent undergoes mutual polymerization, products adhering without formation of the chemical bond scarcely exist. It is thus considered that a silane layer is not formed on the element electrode. However, even either in the case where the surface of the element electrode is made hydrophilic by cleaning with water, or the like, or in the element electrode surface itself, its contact angle with the droplet generally becomes a value within a range of from 20 to 50° in an extremely short period of time after water on the surface is blown off. Therefore, a practical problem is scarcely caused even when no layer of the silane coupling agent is formed.

In this example, as a material for forming an electroconductive thin film, an aqueous solution was used, which was obtained by dissolving tetramonoethanolamine-palladium acetate $[Pd(NH_2CH_2CH_2OH)_4(CH_3COO)_2]$ in an aqueous solution containing 0.05% by weight of polyvinyl alcohol, 15% by weight of 2-propanol and 1% by weight of ethylene glycol so as to give a palladium concentration of about 0.15% by weight.

Droplets of the above-described aqueous solution (ink) were applied four times by an ink-jet apparatus (using a bubble-jet printer head, BC-01 manufactured by Canon Inc.) of the bubble-jet system onto the quartz glass substrate, on which the electrodes 2, 3 had been formed, so as to extend over the electrodes 2 and 3 and overlap one another (FIG. 13B).

At this time, the form of the droplet on the substrate was good in both stability and reproducibility without spreading. The substrate was then calcined at 350° C. for 20 minutes to form an electroconductive thin film 4 (FIG. 13C). In such a manner, 10 elements were produced. The film thickness of the electroconductive thin film in each element was measured through an atomic force microscope. As a result, the film thickness was 15 nm on the average, and a scatter of film thickness among the ten elements was 5%. Their dot diameter was 90 μm on the average, and a scatter of dot diameter among the ten elements was 3%. A resistance between the element electrodes was 2.6 kΩ on the average, and a scatter of resistance among the ten elements was ±100 Ω. The initial contact angles of the droplet with the glass surface was measured by means of a contact angle meter (CA-X Model, trade name, manufactured by Kyowa Kaimen Kagaku K.K.) and was found to be 40°.

The elements produced in the above-described manner were subjected to an energization forming treatment and an activating treatment in the same manner as in Example 4.

With respect to the elements produced in the above-described manner, the electron emission characteristics were determined by means of a measuring and evaluating apparatus illustrated in FIG. 16 under the same conditions as in Example 4. As a result, the electron emission characteristics of the elements produced in Example 7 were such that the element current If was 2 mA±0.05 mA, and the emission current Ie was 3 μA±0.05 μA, both expressed in terms of an average value of 10 elements produced in the same manner as described above and measured under the same conditions.

REFERENTIAL EXAMPLE 2

Droplets of the ink were applied four times by an ink-jet apparatus (using a bubble-jet printer head, BC-01 manufactured by Canon Inc.) of the bubble-jet system onto a substrate, on which element electrodes had been formed, so as to extend over the electrodes 2 and 3 and overlap one another in exactly the same manner as in Example 7 except that the substrate was used immediately without conducting the treatment with trimethylethoxysilane after it was subjected to ultrasonic cleaning with purified water and cleaning with hot purified water of 80° C. and lifted to dry. In such a manner, 10 elements were produced. Upon the application of the ink, the droplet spread beyond the desired position on the glass surface between the element electrodes. The film thickness of the electroconductive thin film after the calcination was measured through an atomic force microscope. As a result, the film thickness was 4 nm on an average of the ten elements and thinner than a half of the film thickness in Example 7. A scatter of film thickness among the ten elements was 38%. A resistance between the element electrodes was 13 kΩ on the average, and a scatter of resistance among the ten elements was ±5 kΩ. The initial contact angles of the droplet with the glass surface was measured by means of a contact angle meter (CA-X Model, trade name, manufactured by Kyowa Kaimen Kagaku K.K.) and was found to be 7°.

These results are shown in Table 2 together with the results of Example 7.

TABLE 2

| | Film thickness | Scatter of film thickness | Resistance between element electrodes | Scatter of Resistance | Contact angle | Scatter of contact angle |
|---|---|---|---|---|---|---|
| Ex. 7 | 15 nm | 5% | 2.6 kΩ | ±100 Ω | 40° | ±3° |
| Ref. Ex. 2 | 4 nm | 38% | 13.0 kΩ | ±5 Ω | 6° | ±3° |

As described above, the hydrophobicity-imparting treatment of the film-forming surface of the substrate permits controlling the contact angle of the droplet with the film-forming surface of the substrate within the range of from 20 to 50°, lessening a difference in surface energy between the glass surface and the element electrodes, preventing the droplet from spreading, and so forming an electroconductive thin film narrow in scatter of film thickness and good in both stability and reproducibility.

EXAMPLE 8

In this example, An electron-emitting element of the type illustrated in FIGS. 4A and 4B was produced in the same manner as in Example 7 except that the hydrophobicity-imparting treatment of the glass substrate, on which the element electrodes 2 and 3 had been formed, was conducted with trimethylchlorosilane represented by the following chemical formula $(CH_3)_3SiCl$.

As a result, the silane coupling agent had higher reactivity because its hydrolyzable group is chlorine, so that the hydrophobicity-imparting treatment was completed in a shorter treatment time than Example 7. In addition, the dot form of the droplet on the substrate was stable without spreading beyond the desired position and is also good in reproducibility. Scatters of film thickness and dot diameter among the elements are also narrow.

EXAMPLE 9

An electron-emitting element of the type illustrated in FIGS. 4A and 4B was produced as an electron-emitting element according to the present invention.

Referring to FIGS. 13A to 13D, a process for producing the electron-emitting element according to this example will be described. A quartz glass substrate was used as a substrate 1. After this substrate was fully washed with an organic solvent, element electrodes 2 and 3 composed of Pt were formed on the surface of the substrate (FIG. 13A).

A gap L between the element electrodes, a length W of each element electrode and a thickness d thereof were preset to 20 μm, 500 μm and 1,000 Å, respectively.

The substrate on which the element electrodes 2, 3 had been formed was then subjected to a hydrophobicity-imparting treatment with 3-aminopropyldimethylethoxysilane represented by the following chemical formula in the following manner.

$H_2NCH_2CH_2CH_2Si(CH_3)_2OCH_2CH_3$

After the substrate on which the element electrodes had been formed was subjected to ultrasonic cleaning with purified water and cleaning with hot purified water of 80° C. and lifted to dry, vapor of 3-aminopropyldimethylethoxysilane was applied to a surface of the glass substrate, on which a film will be formed. More specifically, the substrate was placed in a container in which the vapor of 3-aminopropyldimethylethoxysilane was saturated, left to stand for 1 hour at room temperature (about 22° C.) and then taken out. Subsequently, the thus-treated substrate was subjected to a heat treatment at 110° C. for 10 minutes. By this heating, Si in 3-aminopropyldimethylethoxysilane is bonded (by siloxane bond) to Si in the film-forming surface of the glass substrate in the form of Si—O—Si, whereby aminoalkylsilane is strongly fixed to the film-forming surface of the glass substrate to form a stable silane layer having water repellency.

Figure 19:
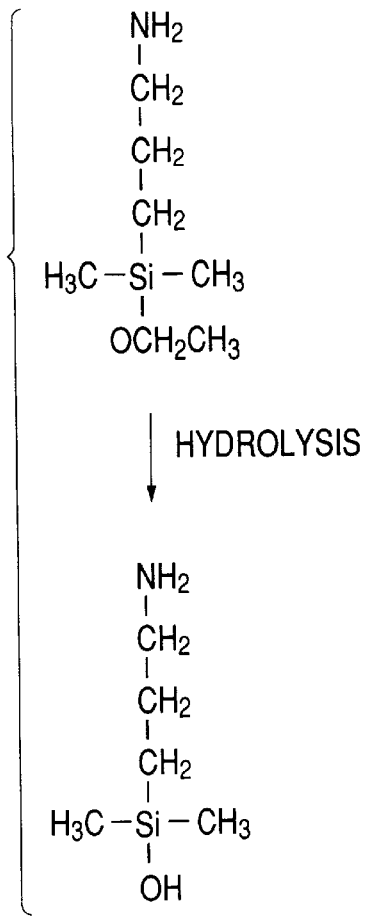
Figure 20:
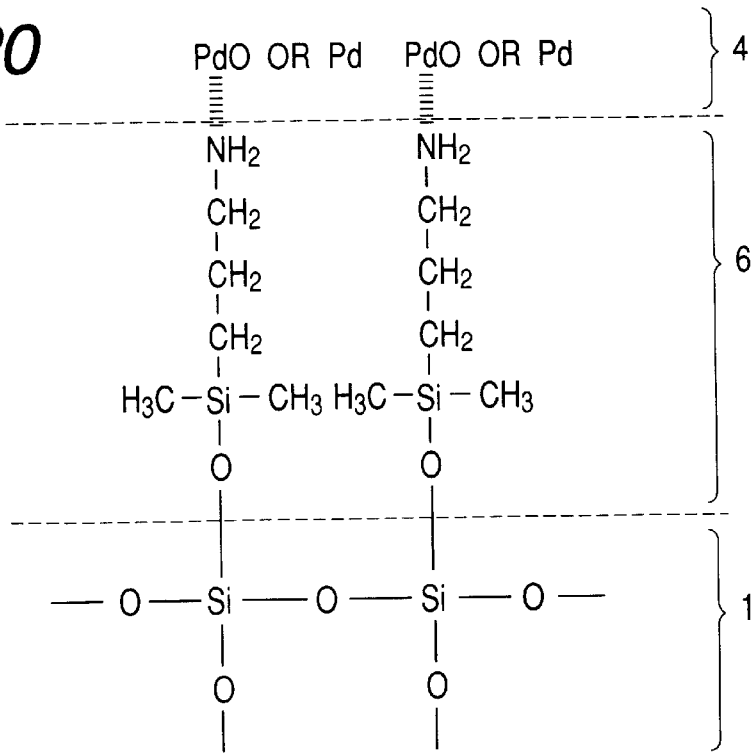

In the process of the formation of this film, it is considered that the following reactions progress. Namely, the ethoxy group, which is hydrolyzable group in 3-aminopropyldimethylethoxysilane, is hydrolyzed with moisture in the air or absorbed water in the substrate as illustrated in FIG. 19 to form a silanol group (—SiOH) on the side of aminopropyldimethylethoxysilane. The silanol group undergoes condensation by dehydration with a silanol group on the side of the film-forming surface of the glass substrate, whereby Si in aminopropyl-dimethylethoxysilane is bonded by siloxane bond to Si in the film-forming surface 6 of the glass substrate as illustrated in FIG. 20.

In this example, as a material for forming an electroconductive thin film, an aqueous solution was used, which was obtained by dissolving tetramonoethanolamine-palladium acetate [Pd(NH$_2$CH$_2$CH$_2$OH)$_4$(CH$_3$COO)$_2$] in an aqueous solution containing 0.05% by weight of polyvinyl alcohol, 15% by weight of 2-propanol and 1% by weight of ethylene glycol so as to give a palladium concentration of about 0.15% by weight.

Droplets of the above-described aqueous solution (ink) were applied four times by an ink-jet apparatus (using a bubble-jet printer head, BC-01 manufactured by Canon Inc.) of the bubble-jet system onto the quartz glass substrate, on which the electrodes 2, 3 had been formed, so as to extend over the electrodes 2 and 3 and overlap one another (FIG. 13B).

At this time, the form of the droplet on the substrate was good in both stability and reproducibility without spreading. The substrate was then calcined at 350° C. for 20 minutes to form an electroconductive thin film 4 (FIG. 13C). In such a manner, 10 elements were produced. The film thickness of the electroconductive thin film in each element was measured through an atomic force microscope. As a result, the film thickness was 15 nm on the average, and a scatter of film thickness among the ten elements was 5%. The initial contact angles of the droplet with the glass surface was measured by means of a contact angle meter (CA-X Model, trade name, manufactured by Kyowa Kaimen Kagaku K.K.) and was found to be 38°.

The elements produced in the above-described manner were subjected to an energization forming treatment and an activating treatment in the same manner as in Example 4.

With respect to the elements produced in the above-described manner, the electron emission characteristics were determined by means of a measuring and evaluating apparatus illustrated in FIG. 16 under the same conditions as in Example 4. As a result, the electron emission characteristics of the elements produced in Example 9 were such that the element current If was 2 mA±0.04 mA, and the emission current Ie was 3 μA±0.04 μA, both expressed in terms of an average value of 10 elements.

REFERENTIAL EXAMPLE 3

Droplets of the same ink as that used in Example 9 were applied four times by an ink-jet apparatus (using a bubble-jet printer head, BC-01 manufactured by Canon Inc.) of the bubble-jet system onto a substrate, on which element electrodes had been formed, so as to extend over the electrodes 2 and 3 and overlap one another in exactly the same manner as in Example 9 except that the substrate was used immediately without conducting the treatment with 3-aminopropyldimethylethoxysilane after it was subjected to ultrasonic cleaning with purified water and cleaning with hot purified water of 80° C. and lifted to dry. Thereafter, the same procedure as in Example 9 was performed to produce 10 elements. Upon the application of the ink, the droplet spread beyond the desired position on the glass surface between the element electrodes. The film thickness of the electroconductive thin film after the calcination was measured through an atomic force microscope. As a result, the film thickness was 4 nm on an average of the ten elements and thinner than a half of the film thickness in Example 9. A scatter of film thickness among the ten elements was 30%. A resistance between the element electrodes was 16 kΩ on the average, and a scatter of resistance among the ten elements was ±7 kΩ. The initial contact angles of the droplet with the glass surface was measured by means of a contact angle meter (CA-X Model, trade name, manufactured by Kyowa Kaimen Kagaku K.K.) and was found to be 5°.

These results are shown in Table 3 together with the results of Example 9.

TABLE 3

| | Film thickness | Scatter of film thickness | Resistance between element electrodes | Scatter of Resistance | Contact angle | Scatter of contact angle |
|---|---|---|---|---|---|---|
| Ex. 9 | 15 nm | 5% | 2.4 kΩ | ±90 Ω | 38° | ±3° |
| Ref. Ex. 3 | 4 nm | 30% | 16.0 kΩ | ±7k Ω | 5° | ±3° |

As described above, the hydrophobicity-imparting treatment of the film-forming surface of the substrate permits controlling the contact angle of the droplet with the film-forming surface of the substrate within the range of from 20 to 50°, preventing the droplet from spreading, and so forming an electroconductive thin film narrow in scatters of film thickness and resistance and good in both stability and reproducibility.

A main metal forming the electroconductive thin film according to this example is palladium, so that the electroconductive thin film formed has higher adhesion due to interaction between the amino group present in the silane layer, which is an electron donative group, and palladium present in the electroconductive thin film compared with that in

REFERENTIAL EXAMPLE 3

The electric heat-proof temperature of the electroconductive thin film is considered to be enhanced because it is considered that the interaction between the amino group of an electron donative group present in the silane layer and palladium present in the electroconductive thin film prevents the resistance of the electroconductive thin film from rapidly rising due to a phenomenon that seems to be aggregation of the thin film. The term "electric heat-proof temperature" means a temperature at which the aggregation of the electroconductive thin film is advanced to prevent conduction.

EXAMPLE 10

In this example, an electron-emitting element of the type illustrated in FIGS. 4A and 4B was produced in the same manner as in Example 9 except that the hydrophobicity-imparting treatment of the glass substrate, on which the element electrodes 2 and 3 had been formed, was conducted with ethoxydimethylvinylsilane represented by the following chemical formula

H$_2$C=CHSi(CH$_3$)$_2$OCH$_2$CH$_3$.

The dot form of the droplet on the substrate was stable without spreading beyond the desired position and is also good in reproducibility. Scatters of film thickness and dot diameter among the elements are also narrow.

EXAMPLE 11

The construction of an electron-emitting element according to this example is the same as the electron-emitting element illustrated in FIGS. 4A and 4B.

Referring to FIGS. 13A to 13D, a process for producing the electron-emitting element according to this example will be described.

Step 1:

A pattern of element electrodes was formed with a photoresist on a cleaned soda lime glass substrate 1, and a Pt film having a thickness of 500 Å was deposited by a vacuum deposition process. The photoresist pattern was dissolved in an organic solvent to lift off the deposited film, thereby forming element electrodes 2 and 3 with a gap L between them preset to 20 μm (FIG. 13A). The substrate was washed with purified water.

Step 2:

After the substrate 1 on which the element electrodes 2, 3 had been formed was cleaned with hot water, a proper amount of droplets of an organic metal-containing aqueous solution was applied to the substrate to measure a contact angle of the droplet with the substrate by means of a contact angle meter.

Step 3:

After the substrate prepared in Step 2 was placed in a chamber, the chamber was purged with nitrogen under atmospheric pressure and charged with an organic gas, and the substrate was left to stand therein. More specifically, di-2-ethylhexyl phthalate was purified at 113 to 122° C. to remove low-boiling matter and high-boiling matter. The remainder was placed in a surface energy-adjusting ampule illustrated in FIG. 8, heated at 100° C. and charged into the chamber under a pressure of $2 \times 10^{-8}$ Torr which is a saturated vapor pressure of the organic substance. After 10 minutes, the charging of the organic gas was stopped, and the chamber was purged with nitrogen gas, and the substrate was left to stand therein. The substrate 1 was properly taken out (a) during the charging of the organic substance and (b) after stopping the charging of the organic substance and purging with nitrogen gas to measure the contact angle in the same manner as in Step 2.

Step 4:

Droplets of an aqueous solution (ink) of organic Pd compound [an aqueous solution containing 0.15% by weight of Pd, 15% by weight of IPA, 1% by weight of ethylene glycol and 0.05% by weight of polyvinyl alcohol (PVA)] were applied four times by an ink-jet method called bubble-jet system onto the element electrodes formed in Step 1 and between the element electrodes to overlap one another (FIG. 13B).

Step 5:

A sample prepared in Step 4 was calcined at 350° C. in the air. An electroconductive thin film 4 composed of fine particles of PdO was formed. Through the above steps, the element electrodes 2, 3 and the electroconductive thin film 4 were formed on the substrate 1 (FIG. 13C).

In the above-described manner, 10 elements were produced to conduct the measurement of contact angle in Steps 2 and 3 and the measurement of resistance of the electroconductive thin film in Step 5. The results are shown in Table 4.

REFERENTIAL EXAMPLE 4

Steps 1 and 2 were conducted in the same manner as in Example 11. In Step 3, the substrate prepared in Step 2 was left to stand for several days in a desiccator containing silica gel as a desiccant. As with Step 2, the contact angle was measured every 4 hours. Steps 4 and 5 were also conducted in the same manner as in Example 11. In the above-described manner, 10 elements were produced. The results are shown in Table 4.

REFERENTIAL EXAMPLE 5

Ten elements were produced in the same manner as in Example 11 except that Step 3 was omitted. The results are shown in Table 4.

TABLE 4

|  | Surface energy adjustor | Contact angle in Step 2 | Contact angle in Step 3 | Resistance in Step 5 |
| --- | --- | --- | --- | --- |
| Ex. 11 | Di-2-ethylhexyl phthalate, $2 \times 10^{-8}$ Torr | Hydrophilic, 5° ± 4° | Water-repellent; saturated at 35° ± 3° | 2.2 kΩ ± 50 Ω |
| Ref. Ex. 4 | Left to stand in desiccator | Hydrophilic, 5° ± 4° | Water-repellent; increased over 24 hours; after this, saturated at 26° ± 4° | 2.2 kΩ ± 120 Ω |
| Ref. Ex. 5 | Not treated | Hydrophilic, 6° ± 3° | Not treated | 14 kΩ ± 6 kΩ |

From the above results, the following facts were shown.

In Step 2, wettability is high, and a hydrophilic surface is formed. In Step 3, water-repellent surfaces are formed with time under the atmosphere of the organic substance and tend to be saturated in both Example 11 and Referential Example 4. However, the contact angle reaches saturation at a several-minute level in Example 11, while Referential Example 4 takes at least 24 hours to reach saturation of contact angle. In Example 11 and Referential Example 4, a scatter of contact angle is narrow. It is however apparent that a scatter of contact angle is wide in Referential Example 5. According to morphological observation, this is considered to be attributable to the fact that in Example 11 and Referential Example 4, the form of the electroconductive thin film is circular with high evenness, while the form of the electroconductive thin film varies in Referential Example 5 due to high wettability resulted from the omission of Step 3.

As described above, the hydrophilic surface is formed by cleaning the substrate with hot water, and so the surface energy of the substrate is initialized. In the step of adjusting the surface energy of the initialized substrate with the organic gas, a scatter of surface energy is narrowed, and so the form of the droplet of the organic metal-containing aqueous solution applied by the ink-jet system is stabilized. As a result, it is considered that a scatter of resistance among the electroconductive thin films is also narrowed. In Referential Example 4, it is considered that organic substances present in a trace amount adhere to the substrate in a long period of time, and so the water-repellent surface is formed like this example.

The elements produced in the above-described manner were subjected to an energization forming treatment and an activating treatment in the same manner as in Example 4.

With respect to the elements produced in the above-described manner, the electron emission characteristics were determined by means of a measuring and evaluating apparatus illustrated in FIG. 16 under the same conditions as in Example 4.

The electron emission characteristics of the elements produced in Example 11 were such that the element current If was 2 mA±0.03 mA, and the emission current Ie was 3 μA±0.03 μA, both expressed in terms of an average value of 10 elements. On the other hand, the elements according to Referential Example 4 are narrow in scatter of electron emission characteristics like the elements of Example 11. Besides, the electron emission characteristics of the elements produced in Referential Example 5 were such that the element current If was 0.29 mA±0.02 mA, and the emission current Ie was 0.7 μA±0.05 μA, both expressed in terms of an average value of 10 elements. As a result, it was found that the electron emission characteristics of the elements according to Example 11 and Referential Example 4 are narrow in scatter compared with those of Referential Example 5 and are hence good.

As described above, it was found that when the adjustment of the surface energy of the substrate is conducted in the atmosphere of the organic gas, the form of the resulting electroconductive thin film is controlled, resulting in a contribution to narrowing of scatter of the characteristics of the electron-emitting elements.

EXAMPLE 12

Figure 21A:
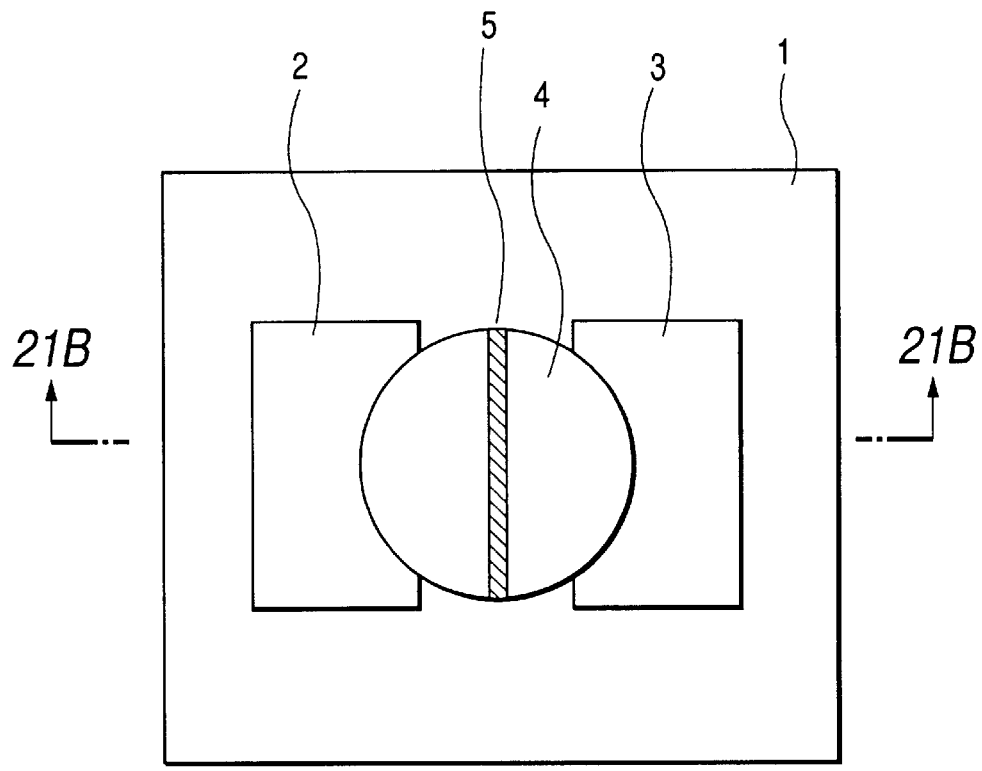
FIGS. 21A and 21B are a schematic plan view and cross-sectional view, respectively, illustrating the construction of another surface conduction type electron-emitting element to which the present invention is applied.
Figure 21B:
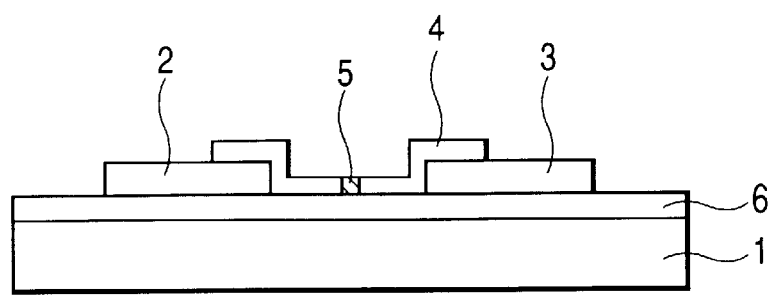

This example relates to a process for producing an electron-emitting element illustrated in FIGS. 21A and 21B and describes an experiment for retreating a substrate in the case where the contact angle of the substrate with an ink has deviated from the preferred contact angle (20° to 50°) after adjusting the surface energy of the substrate and then leaving the substrate to stand for a long period of time in the air. The experiment will hereinafter be described in due order. As with Example 11, 10 elements were produced according to the following steps.

Step 1:

A pattern of element electrodes was formed with a photoresist on a cleaned soda lime glass substrate 1, on which a titanium oxide film 6 having a thickness of 0.2 μm had been formed by sputtering, and a Pt film having a thickness of 500 Å was deposited by a vacuum deposition process. The photoresist pattern was dissolved in an organic solvent to lift off the deposited film, thereby forming element electrodes 2 and 3 with a gap L between them preset to 30 μm.

Step 2:

After the substrate, on which the element electrodes 2, 3 had been formed, was washed with purified water, and exposed for 5 minutes to ultraviolet rays from a halogen lamp, a proper amount of droplets of an organic metal-containing aqueous solution was applied to the substrate to measure a contact angle of the droplet with the substrate by means of a contact angle meter.

Step 3:

After the substrate prepared in Step 2 was placed in a chamber, the chamber was evacuated and then charged with an organic gas like Example 11. More specifically, purified di-2-ethylhexyl phthalate was placed in a surface energy-adjusting ampule illustrated in FIG. 8, heated at 100° C. and charged into the chamber under a pressure of 2×10⁻⁸ Torr which is a saturated vapor pressure of the organic substance. After 10 minutes, the charging of the organic gas was stopped, and the chamber was evacuated. The substrate 1 was then taken out of the chamber and left to stand for 70 days in the air to measure the contact angle in the same manner as in Step 2. The contact angle was 45±+8°.

Since some of 10 elements had a contact angle outside the range of from 20° to 50°, Step 2 and the exposure to the organic gas of Step 3 were conducted again. Thereafter, the subsequent steps were performed.

Step 4:

Droplets of an aqueous solution (ink) of organic Pd compound [an aqueous solution containing 0.15% by weight of Pd, 15% by weight of IPA, 1% by weight of ethylene glycol and 0.05% by weight of polyvinyl alcohol (PVA)] were applied four times by an ink-jet method called bubble-jet system onto the element electrodes formed and between the element electrodes to overlap one another.

Step 5:

A sample prepared in Step 4 was calcined at 350° C. in the air. An electroconductive thin film 4 composed of fine particles of PdO was formed. Through the above steps, the element electrodes 2, 3 and the electroconductive thin film 4 were formed on the substrate 1.

Thereafter, an energization forming treatment and an activating treatment were conducted in the same manner as in Example 4. With respect to the ten elements produced in the above-described manner, the electron emission characteristics were determined by means of a measuring and evaluating apparatus illustrated in FIG. 16 under the same conditions as in Example 4.

The results are shown in Table 5. As shown in Table 5, similar results to Example 11 were able to be obtained in Example 12 by repeating steps 2 and 3 though the contact angle of the substrate steeply deviated from the proper range.

From the above results, it was found that even when the surface energy of the substrate exceeds the tolerance from its reference value from an unknown cause before the organic metal-containing aqueous solution is applied to the substrate, an electron-emitting element having high evenness and good electron emission characteristics can be provided by conducting the step of reducing the surface energy of the substrate by irradiation of light to initializing the surface energy and the step of adjusting the surface energy of the substrate repeatedly and following the subsequent steps. Therefore, electron-emitting elements can be cheaply produced with high yield.

TABLE 5

| Contact angle in Step 2 | Contact angle in Step 3 | Contact angle after left to stand in the air | Contact angle after performing Steps 2 and 3 again | Electron emission characteristic |
|---|---|---|---|---|
| Ex. 12 Hydrophilic; unmeasurable due to high wettability | Water-repellent; 37° ± 3°0 | 45° ±8° | Water-repellent; 36° ± 2° | Element current If: 2mA ± 0.03mA; Emission current Ie: 3 μA ± 0.03 μA |

EXAMPLE 13

The construction of an electron-emitting element according to this example is the same as the electron-emitting element illustrated in FIGS. 21A and 21B.

A process for producing the electron-emitting element according to this example will hereinafter be described in due order.

Step a:

A pattern of element electrodes was formed with a photoresist (RD-2000N, trade name, product of Hitachi Chemical Co., Ltd.) on a cleaned soda lime glass substrate 1, on which a titanium oxide film 6 having a thickness of 2,000 Å had been formed by sputtering, and a Pt film having a thickness of 500 Å was deposited by a vacuum deposition process. The photoresist pattern was dissolved in an organic solvent to lift off the deposited film, thereby forming element electrodes 2 and 3 with a gap L between them preset to 20 μm.

Step b:

After the substrate, on which the element electrodes 2, 3 had been formed, was washed with purified water, and exposed for 5 minutes to ultraviolet rays from a halogen lamp, a proper amount of droplets of an organic metal-containing aqueous solution was applied to 4 corners of the substrate to measure a contact angle of the droplet with the substrate by means of a contact angle meter.

Step c:

The substrate prepared in Step b was left to stand for several days in a desiccator containing silica gel as a desiccant. As with Step b, the contact angle was measured every 8 hours.

Step d:

Droplets of an aqueous solution (ink) containing monoethanolamine-palladium acetate (Pd content: 0.15% by weight), 15% by weight of isopropyl alcohol, 1% by weight of ethylene glycol and 0.05% by weight of polyvinyl alcohol were applied four times by an ink-jet method called a bubble-jet system onto the element electrodes and between the element electrodes to overlap one another.

Step e:

A sample prepared in Step d was calcined at 350° C. in the air. An electroconductive thin film 4 composed of fine particles of PdO was formed. Through the above steps, the element electrodes 2, 3 and the electroconductive thin film 4 were formed on the substrate 1.

Ten elements were produced in accordance with the above-described process.

REFERENTIAL EXAMPLE 6

An electroconductive thin film for an electron-emitting element was formed in the same manner as in Example 13 except that the ultraviolet-light irradiation in Step b was not conducted. In Step b, only the measurement of contact angle was performed. Ten elements were produced in accordance with the above-described process.

REFERENTIAL EXAMPLE 7

An electroconductive thin film for an electron-emitting element was formed in the same manner as in Example 13 except that a part of Step a was changed, and Step b was not conducted. In Step a, a SiOX film having a thickness of 0.5 µm was formed by sputtering on a cleaned soda lime glass substrate 1 in place of the titanium oxide film. Ten elements were produced in accordance with the above-described process.

The measurement results of contact angle and resistance in the course of the process in Example 13 and Referential Examples 6 and 7 are shown in Table 6. Incidentally, the results shown in Table 6 are all average values of 10 elements.

From Table 6, the following facts were shown. In Step b of Example 13, the surface of the titanium oxide layer is made highly wettable by irradiation of light from the halogen lamp, so that a hydrophilic surface the contact angle of which can be measured is formed. On the other hand, the surfaces in Referential Examples 6 and 7 are also hydrophilic surfaces, but their surface energy varies. On each example, in Step c, a water-repellent surface was formed as time went on and tended to be saturated. However, it was found that a scatter of contact angle is narrow in Example 13, but a scatter of contact angle is wide in both Referential Examples 6 and 7. This is considered to depend on the step of initializing the surface energy of the substrate. In Step e, a scatter of resistance is narrow in Example 13, but a scatter of resistance seems to be wide in both Referential Examples 6 and 7. This is considered to correspond to a scatter of form among droplets caused by the influence on the stability of the droplets applied by the ink-jet system also depending on the step of initializing the surface energy of the substrate.

As described above, the hydrophilic surface is formed by laminating the titanium oxide layer on the substrate and exposing the titanium oxide layer to light, and a scatter of surface energy in the step of adjusting the surface energy is narrowed by initializing the surface energy of the substrate, so that the form of the droplets of the organic metal-containing aqueous solution applied by the ink-jet system is stabilized. As a result, it is considered that a scatter of resistance among the electroconductive thin films is also narrowed.

TABLE 6

| | Contact angle in Step b | Contact angle in Step c | Resistance in Step e |
|---|---|---|---|
| Ex. 13 | Hydrophilic; unmeasurable due to high wettability | Water-repellent; increased over 24 hours; after this, saturated at 28° ± 1° | 2.2 kΩ ± 80 Ω |
| Ref. Ex. 6 | Hydrophilic; 5° ± 4° | Water-repellent; increased over 24 hours; after this, saturated at 26° ± 4° | 2.2 kΩ ± 120 Ω |
| Ref. Ex. 7 | Hydrophilic; 6° ± 4° | Water-repellent; increased over 24 hours; after this, saturated at 27° ± 3° | 2.2 kΩ ± 120 Ω |

Thereafter, an energization forming treatment and an activating treatment were conducted in the same manner as in Example 4. With respect to the elements produced in the above-described manner, the electron emission characteristics were determined by means of a measuring and evaluating apparatus illustrated in FIG. 16 under the same conditions as in Example 4.

The electron emission characteristics of the elements produced in Example 13 were such that the element current If was 2 mA±0.04 mA, and the emission current Ie was 3 µA±0.05 µA, both expressed in terms of an average value of 10 elements. On the other hand, the electron emission characteristics of the elements produced in Referential Example 7 were such that the element current If was 1.8 mA±0.1 mA, and the emission current Ie was 2.7 µA±0.09 µA, both expressed in terms of an average value of 10 elements. In addition, both element current and emission current show non-linear characteristics to element voltage and have respective clear threshold values.

As a result, it was found that the electron emission characteristics of the elements according to Example 13 are narrow in scatter compared with those of Referential Example 7 and are hence good. After driving for a certain period of time, the electron emission characteristics were measured. As a result, it was found that reduction in both element current If and emission current Ie in Example 13 is little compared with Referential Example 7.

As described above, it was found that the initialization of the surface energy of the substrate also contributes to narrowing of scatter of the characteristics of the electron-emitting elements. The stability upon driving is considered to be attributable to increase in adhesion of the electroconductive thin film to the substrate due to the lamination of the titanium oxide layer on the substrate.

EXAMPLE 14

This example describes an experiment for retreating a substrate in the case where the contact angle of a substrate with an ink has deviated from the preferred contact angle (20° to 50°) when the substrate was left to stand for a long period of time in the air in Step c of Example 13. The experiment will hereinafter be described in due order.

A substrate subjected to Steps a, b and c of Example 13 was prepared and left to stand for 70 days in the air. Thereafter, the contact angle was measured in the same manner as in Example 13 and was found to increase to 40°±12° in terms of an average value of 10 elements.

In this example, such a substrate was then subjected again to Steps 2 and 3 of Example 13. Thereafter, the subsequent steps d and e of Example 13, an energization forming treatment and an activating treatment, were performed. The results are shown in Table 7.

REFERENTIAL EXAMPLE 8

As with Example 14, a substrate subjected to Steps a, b and c of Example 13 was prepared and left to stand for 70 days in the air. Thereafter, the contact angle was measured in the same manner as in Example 13 and was found to be 40°±12° in terms of an average value of 10 elements. Thereafter, the subsequent steps d and e of Example 13, an energization forming treatment and an activating treatment, were performed. The results are shown in Table 7.

As shown in Table 7, similar results to Example 13 were able to be obtained in Example 14 by repeating steps b and c though the contact angle of the substrate steeply deviated from the proper range. On the other hand, it is considered that in Referential Example 8, deterioration and scatter of electron emission characteristics are increased by the steep deviation of the contact angle of the substrate from the proper range.

From the above results, it was found that even when the surface energy of the substrate exceeds the tolerance from its reference value from an unknown cause before the organic metal-containing aqueous solution is applied to the substrate, an electron-emitting element having high evenness and good electron emission characteristics can be provided by conducting the step of reducing the surface energy of the substrate by irradiation of light to initializing the surface energy and the step of adjusting the surface energy of the substrate repeatedly and following the subsequent steps. Therefore, electron-emitting elements can be cheaply produced with high yield.

TABLE 7

|  | Contact angle in Step b | Contact angle in Step c | Contact angle after left to stand in the air | Contact angle after performing Steps b and c again | Electron emission characteristic |
|---|---|---|---|---|---|
| Ex. 14 | Hydrophilic; unmeasurable due to high wettability | Water-repellent; 28° ± 1° | 40° ± 12° | Water-repellent; 28° ± 1°0 | Element current If: 2 mA ± 0.04 mA; Emission current Ie: 3 µA ± 0.04 µA |
| Ref. 8 | Hydrophilic; unmeasurable due to high wettability | Water-repellent; 28° ± 1° | 40° ± 12° | Not treated | Element current If: 1.8 mA ± 0.2 mA; Emission current Ie: 2.8 µA ± 0.15 µA |

EXAMPLE 15

In this example, an image-forming apparatus was produced.

Figure 22A:
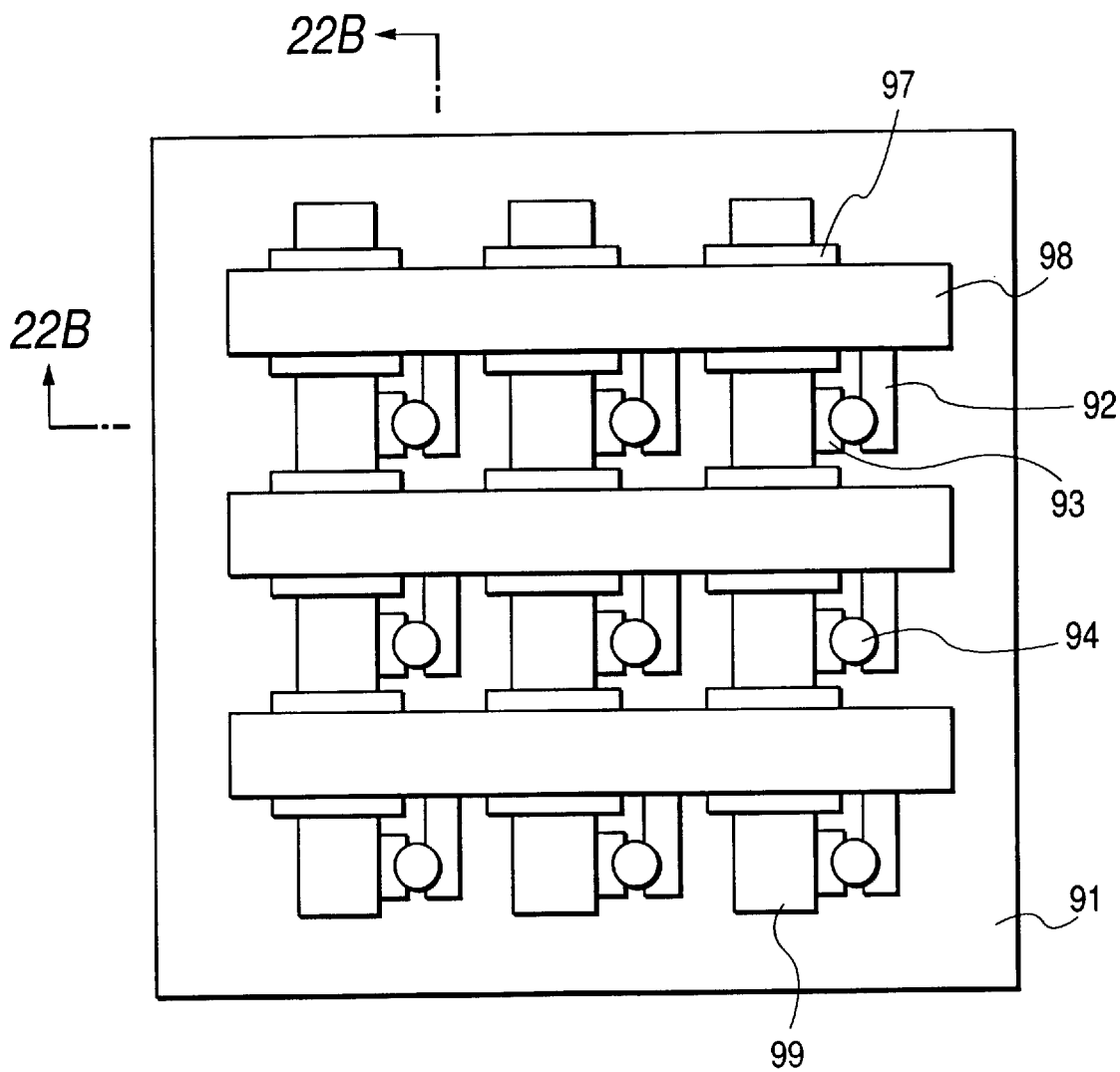
FIGS. 22A and 22B schematically illustrate the construction of an electron source to which the present invention is applied.
Figure 22B:
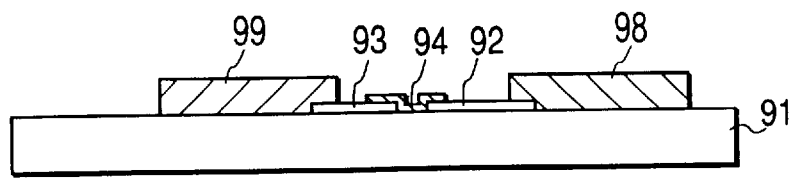
Figure 23:
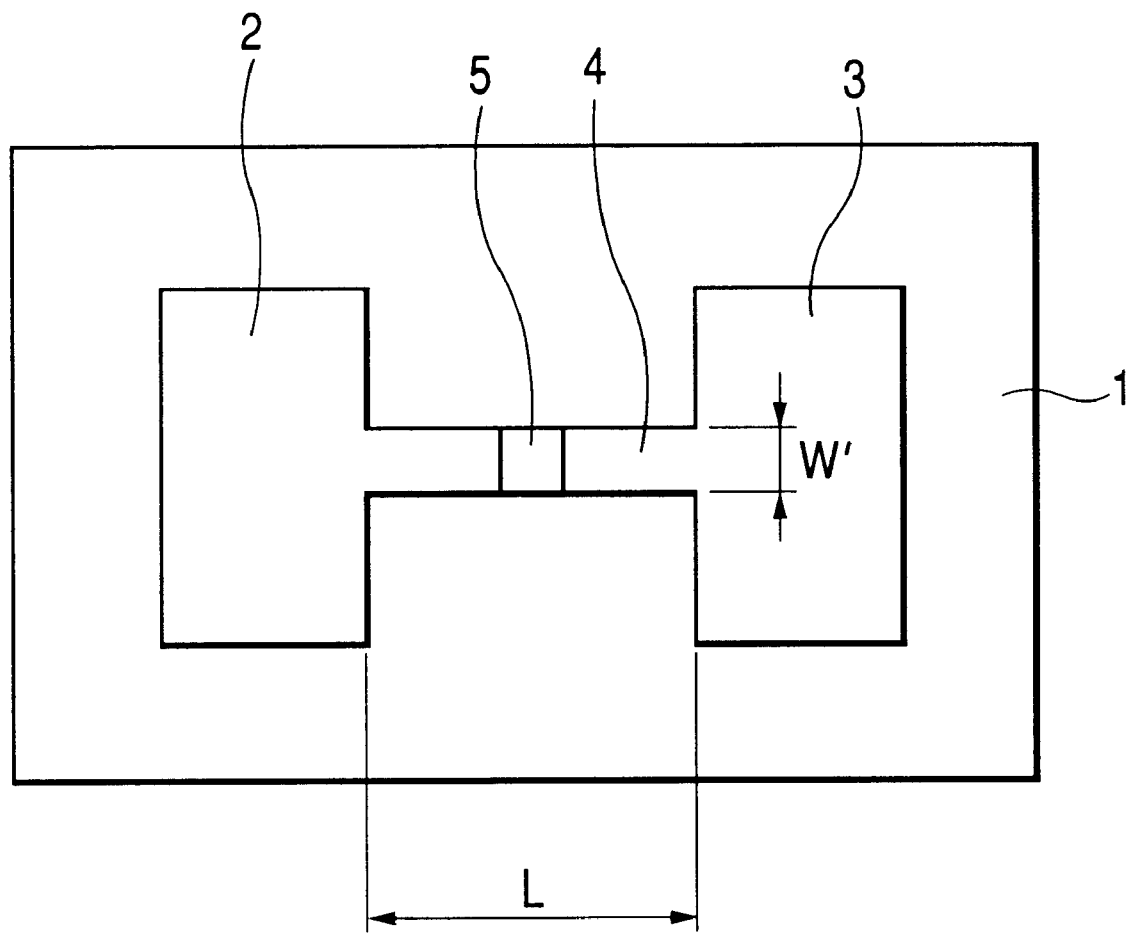
FIG. 23 illustrates a conventional electron-emitting element.

FIG. 22A is a side elevation view illustrating a part of an electron source, and FIG. 22B is a cross-sectional view illustrating an element. In the drawings, reference numeral 91 designates a substrate, 98 a row-direction wiring corresponding to Doxm, 99 a column-direction wiring corresponding to Doyn, 94 an electroconductive thin film, 92 and 93 element electrodes, and 97 an insulating interlayer. The image-forming apparatus according to this example has the same construction as that illustrated in FIG. 9 except that a substrate 91 was used as a rear plate. FIG. 11 illustrates an exemplary construction of a driving circuit for television display based on television signals of the NTSC system.

The production process will be described specifically in order of step.

Step 1:

Element electrodes 92, 93 were formed by offset printing on a cleaned soda lime glass substrate 1. A gap L between the element electrodes and a width W of each element electrode were preset to 20 µm and 125 µm, respectively.

Step 2:

Column wiring 99 was formed by screen printing. An insulating interlayer 97 having a thickness of 10 µm was formed by screen printing. Further, row wiring 98 was printed.

Step 3:

The substrate, on which the element electrodes, wirings and insulating interlayer had been formed, was then subjected to a hydrophobicity-imparting treatment with trimethylethoxysilane [$(CH_3)_3SiOCH_2CH_3$] used in Example 7. The hydrophobicity-imparting treatment was conducted in the same manner as in Example 7.

Step 4:

Droplets of an aqueous solution (ink) obtained by dissolving tetramonoethanolamine-palladium acetate [$Pd(NH_2CH_2CH_2OH)_4(CH_3COO)_2$] in an aqueous solution containing 0.05% by weight of polyvinyl alcohol, 15% by weight of 2-propanol and 1% by weight of ethylene glycol so as to give a palladium concentration of about 0.15% by weight were applied four times by an ink-jet apparatus (using a bubble-jet printer head, BC-01 manufactured by Canon Inc.) of the bubble-jet system onto the substrate surface between the electrodes 2, 3 so as to extend over the electrodes 2 and 3. This substrate was calcined to form the electroconductive thin layer 94 extending over the element electrodes.

Step 5:

A face plate was then formed. The face plate was constituted of a glass substrate having a phosphor film containing phosphors and a metal back, both formed on the inside face thereof. The phosphors are arranged by providing a black stripe among three primary color phosphors. As a material for the black stripe, an ordinary material composed mainly of graphite was used. These were all formed by screen printing.

Step 6:

The substrate formed in Steps 1 to 4 was used as a rear plate and fusion-sealed to a face plate through a support frame. An exhaust tube used for ventilation was bonded to the support frame in advance.

Step 7:

After evacuating to $10^{-7}$ Torr, an energization forming treatment was conducted on every line by a production unit capable of applying voltage to each element through each wiring Doxm, Doyn. The conditions for the energization forming treatment were the same as in Example 7.

Step 8:

After evacuating to $10^{-7}$ Torr, acetone was introduced to $10^{-3}$ Torr through the exhaust tube, and voltage was applied by the production unit capable of applying voltage to each element through each wiring Doxm, Doyn in such a manner that the same pulse voltage as used in Example 7 was applied to each element by line sequential scan, thereby conducting an activating step. The activating step was ended at the time an element current in each line reached 3 mA on the average when the voltage was applied to each line for 25 minutes.

Step 9:

After evacuation was fully performed through the exhaust tube, the evacuation was conducted while heating the whole container at 250° C. for 3 hours. Finally, a getter was flashed, and the exhaust tube was sealed.

An exemplary construction of the driving circuit for television display based on television signals of the NTSC system in the image-forming apparatus constructed with the thus-produced electron source of a simple matrix arrangement will be described with reference to FIG. 11.

In FIG. 11, reference numeral 101 indicates a display panel for image display, 102 a scanning circuit, 103 a control circuit, and 104 a shift resister. Reference numeral 105 designates a line memory, 106 a synchronizing signal-dividing circuit, 107 a modulating signal generator, and Vx and Va dc voltage sources. Incidentally, in this example, m and n were preset to 150 and 450, respectively. The display panel 101 is connected to an external electric circuit through terminals Dox1 to Doxm, terminals Doy1 to Doyn and a high-voltage terminal Hv. To the terminal Dox1 to Doxm, scanning signals were sequentially applied for driving an electron source, i.e., a group of electron-emitting elements arranged in a matrix of M rows and N columns, every line (N elements).

A modulating signal for controlling the output electron beam of each of the electron-emitting elements on one line selected by the above-mentioned scanning signal is applied to terminals Dy1 through Dyn. A dc voltage of, for example, 10V from the dc source is applied to a high voltage terminal Hv. The voltage is an accelerating voltage for applying to the electron beam emitted from the electron-emitting element an energy sufficient to excite the fluorescent substance.

The scanning circuit 102 is described. The circuit includes M switching elements therein (schematically illustrated by S1 to Sm in the drawing). The respective switching elements select one of output voltage of a dc voltage source Vx or 0 V (ground level) and is electrically connected to the terminals Dox1 to Doxm of the display panel 101. The switching elements S1 to Sm are operated on the basis of control signals $T_{scan}$ outputted by the control circuit 103 and can be constructed, for example, by combining switching elements such as FET with one another.

In this example, the dc voltage source Vx is preset so as to output such certain voltage that a driving voltage applied to an element not scanned on the basis of the characteristics (electron emission threshold voltage) of the electron-emitting element is lower than the electron emission threshold voltage.

The control circuit 103 has a function of aligning the operations of the individual parts so as to make a suitable display based on image signals inputted from the outside. The control circuit 103 generates respective control signals of $T_{scan}$, $T_{sft}$ and $T_{mry}$ to the individual parts based on a synchronizing signal $T_{Syc}$ sent from a synchronizing signal-dividing circuit 106.

The synchronizing signal-dividing circuit 106 is a circuit for dividing a television signal of the NTSC system inputted from the outside into a synchronizing signal component and a luminance signal component and can be constructed by using a general frequency dividing (filtering) circuit. The synchronizing signal divided by the synchronizing signal-dividing circuit 106 is composed of a vertical synchronizing signal and a horizontal synchronizing signal. In this example, however, it is illustrated as the $T_{sync}$ signal for the sake of convenient explanation. The luminance signal component for an image divided from the television signal is illustrated as a DATA signal for the sake of convenient explanation. The DATA signal is inputted into the shift resister 104.

The shift resister 104 serves to serial/parallel-convert the DATA signal inputted serially in time series every line of image and operates on the basis of the control signal $T_{sft}$ sent from the control circuit 103 (namely, the control signal $T_{sft}$ may be said to be a shift clock for the shift resister 104). The serial/parallel-converted data for a line of image (corresponding to the driving data for N electron-emitting elements) is outputted as N parallel signals Id1 to Idn from the shift resister 104.

The line memory 105 is a storage device for storing the data for a line of image only for a necessary period of time and suitably stores the contents of Id1 to Idn according to the control signal $T_{mry}$ sent from the control circuit 103. The stored contents are outputted as Id'1 to Id'n and inputted into the modulating signal generator 107. The modulating signal generator 107 is a signal source for suitably driving and modulating the respective electron-emitting elements according to the image data Id'1 to Id'n. The output signal thereof is applied to the electron-emitting elements in the display panel 101 through the terminals Doy1 to Doyn.

In this apparatus, the modulation was conducted by a pulse-width modulation system. When the pulse-width modulation system is practiced, such a circuit of the pulse-width modulation system that voltage pulses of a certain peak value are generated to suitably modulate the width of the voltage pulses according to the data inputted may be used as the modulating signal generator 107.

As the shift resister 104 and line memory 105, either digital signal type or analogue signal type may be used because it is only necessary that the serial/parallel conversion and storage of the image signal can be conducted at a predetermined speed.

Electron emission is caused by applying voltage to the respective electron-emitting elements in the display panel through the external terminals Dox1 to Doxm and Doy1 to Doyn by such a driving circuit.

High voltage is applied to the metal back 85 through the high-voltage terminal Hv to accelerate electron beams. The accelerated electrons collide with the phosphor film 84 to emit light, whereby an image is formed.

An inexpensive image-forming apparatus which scarcely causes luminance irregularity can be produced with good reproducibility by the process described above.

EXAMPLE 16

In this example, an image-forming apparatus was produced in the same manner as in Example 15 except that the hydrophobicity-imparting treatment in Step 3 of Example 15 was conducted with trimethylchlorosilane in place of trimethylethoxysilane. According to this example, an inexpensive image-forming apparatus which scarcely causes luminance irregularity can also be produced with good reproducibility.

EXAMPLE 17

In this example, an image-forming apparatus was produced in the same manner as in Example 15 except that the hydrophobicity-imparting treatment in Step 3 of Example 15 was conducted with 3-aminopropyldimethyl-ethoxysilane in place of trimethylethoxysilane according to the same process as in Example 9. According to this example, an inexpensive image-forming apparatus which scarcely causes luminance irregularity can also be produced with good reproducibility.

EXAMPLE 18

In this example, an image-forming apparatus was produced in the same manner as in Example 15 except that the hydrophobicity-imparting treatment in Step 3 of Example 15 was conducted with ethoxydimethylvinylsilane in place of trimethylethoxysilane according to the same process as in Example 10. According to this example, an inexpensive image-forming apparatus which scarcely causes luminance irregularity can also be produced with good reproducibility.

EXAMPLE 19

An image-forming apparatus according to this example is the same as the image-forming apparatus illustrated in FIG. 9 using the electron source illustrated in FIG. 22 and is produced in accordance with the following process.
Step 1:
Element electrodes 92 and 93 were formed by offset printing on a substrate 91 formed by sputtering a titanium oxide film having a thickness of 0.1 $\mu$m on a cleaned soda lime glass substrate 1. A gap L between the element electrodes and a width W of each element electrode were preset to 20 $\mu$m and 125 $\mu$m, respectively.
Step 2:
Column-direction wiring 99, insulating interlayer 97 and row-direction wiring 98 were then formed by screen printing.
Step 3:
The substrate, on which the row- and column-direction wirings, and the element electrodes had been formed, was washed with purified water and then dried.
Step 4:
After the thus-treated substrate was exposed for 5 minutes to ultraviolet rays from a halogen lamp, a proper amount of droplets of an organic metal-containing aqueous solution was applied to the substrate at a contact angle-monitoring parts in the corners thereof to measure a contact angle of the droplet with the substrate by means of a contact angle meter.
Step 5:
After the substrate prepared in Step 4 was placed in a chamber, the chamber was purged with nitrogen under atmospheric pressure and charged with a gas in the same manner as in Example 11, and the substrate was left to stand therein. The contact angle was measured right before the substrate was subjected to Step 6. If the contact angle measured was greater than 45° or smaller than 30°, the substrate was returned to Step 4 to conduct initialization again, and Step 5 was additionally conducted.
Step 6:
Droplets of an aqueous solution (ink) of organic Pd compound (an aqueous solution containing 0.15% by weight of Pd, 15% by weight of IPA, 1% by weight of ethylene glycol and 0.05% by weight of polyvinyl alcohol) were applied three times by an ink-jet method called piezo-jet system onto the element electrodes formed and between the element electrodes to overlap one another. This substrate was calcined to form an electroconductive thin film extending over the element electrodes. Resistance between the electrodes in each element was measured. After confirming that the resistance was within the desired resistance range, Steps 5 to 9 were conducted to produce the image-forming apparatus.

Electron emission is caused by applying voltage to the respective electron-emitting elements in the display panel through the external terminals Dox1 to Doxm and Doy1 to Doyn by the driving circuit used in Example 15.

High voltage is applied to the metal back 65 through the high-voltage terminal Hv to accelerate electron beams. The accelerated electrons collide with the phosphor film 64 to emit light, whereby an image is formed.

An inexpensive image-forming apparatus which scarcely causes luminance irregularity can be produced with good reproducibility by the process described above.

EXAMPLE 20

An image-forming apparatus according to this example is the same as the image-forming apparatus illustrated in FIG. 9 using the electron source illustrated in FIG. 22 and is produced in accordance with the following process.
Step 1:
Element electrodes 92 and 93 were formed by offset printing on a cleaned soda lime glass substrate 91 on which a titanium oxide film having a thickness of 0.1 $\mu$m had been formed by sputtering. A gap L between the element electrodes and a width W of each element electrode were preset to 20 $\mu$m and 125 $\mu$m, respectively.
Step 2:
Column wiring 99 was formed by screen printing. An insulating interlayer 97 having a thickness of 1.0 $\mu$m was formed by screen printing. Further, row wiring 98 was printed.
Step 3:
The substrate, on which the row- and column-direction wirings, and the element electrodes had been formed, was washed with purified water and then dried.
Step 4:
After the thus-treated substrate was exposed for 5 minutes to ultraviolet rays from a halogen lamp, a proper amount of droplets of an organic metal-containing aqueous solution was applied to the substrate at contact angle-monitoring parts in the corners thereof to measure a contact angle of the droplet with the substrate by means of a contact angle meter.

Step 5:

The substrate prepared in Step 4 was left to stand for 3 days in a desiccator containing silica gel as a desiccant. The contact angle was measured right before the substrate was subjected to Step 6. If the contact angle measured was greater than 45° or smaller than 30°, the substrate was returned to Step 4 to conduct initialization again.

Step 6:

Droplets of an aqueous solution (ink) containing tetramonoethanolamine-palladium acetate (Pd content: 0.15% by weight), 15% by weight of isopropyl alcohol, 0.8% by weight of ethylene glycol and 0.05% by weight of polyvinyl alcohol) were applied five times by an ink-jet method called piezo-jet system onto the element electrodes formed and between the element electrodes to overlap one another. This substrate was calcined to form an electroconductive thin film extending over the element electrodes. Resistance between the electrodes in each element was measured. After confirming that the resistance was within the desired resistance range, Steps 5 to 9 were conducted to produce the image-forming apparatus.

Electron emission is caused by applying voltage to the respective electron-emitting elements in the display panel through the external terminals Dox1 to Doxm and Doy1 to Doyn by the driving circuit used in Example 15.

High voltage is applied to the metal back 85 through the high-voltage terminal Hv to accelerate electron beams. The accelerated electrons collide with the phosphor film 84 to emit light, whereby an image is formed.

An inexpensive image-forming apparatus which scarcely causes luminance irregularity can be produced with good reproducibility by the process described above.

According to Examples 19 and 20, yield can be further enhanced.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A process for producing a printed substrate, comprising the steps of:

exposing a substrate and a different component to an organic gas as a surface treatment by placing the substrate in an atmosphere of the organic gas and contacting the substrate and the different component with the organic gas to coat the substrate and the different component with an organic material, the different component being formed of a material different from the substrate and being disposed on the substrate; and applying, according to an ink jet method, droplets of a liquid selectively to the coated surfaces of the substrate and the different component to which surfaces an organic substance is adhered, so that a droplet of the liquid rests upon the coated surfaces of both the substrate and the different component, the liquid containing a material for a desired component to be formed on the substrate and on the different component, wherein the humidity in said exposing step is not more than 20%.

2. A process for producing a printed substrate comprising the steps of:

exposing a substrate and a different component to a vapor of a hydrophobic agent as a surface treatment by placing the substrate in the vapor of the hydrophobic agent and contacting the substrate and the different component with the vapor of the hydrophobic agent to coat the substrate and the different component with the hydrophobic agent, the different component being formed of a material different from the substrate and being disposed on the substrate; and applying, according to an ink jet method, droplets of a liquid selectively to the coated surfaces of the substrate and the different component to which surfaces the hydrophobic agent is adhered, so that a droplet of the liquid rests upon the coated surfaces of both the substrate and the different component, the liquid containing a material for a desired component to be formed on the substrate and on the different component, wherein the humidity in said exposing step is not more than 20%.

3. A process for producing an electron-emitting element comprising an electroconductive thin film that has an electron-emitting part and is between electrodes, wherein the electroconductive thin film is formed by a method that comprises the steps of:

exposing a substrate and electrodes to an organic gas as a surface treatment by placing the substrate in an atmosphere of the organic gas and contacting the substrate and the electrodes with the organic gas, the electrodes being formed of a material different from the substrate and being disposed on the substrate; and applying, according to an ink jet method, droplets of a liquid containing a material for the electroconductive thin film selectively to the treated surfaces of the substrate and the electrodes to which an organic substance is adhered to form the electroconductive thin film on the substrate surface between the electrodes and on a part of the surface of the electrodes, wherein the humidity in said exposing step is not more than 20%.

4. A process for producing an electron-emitting element comprising an electroconductive thin film that has an electron-emitting part and is between electrodes, wherein the electroconductive thin film is formed by a method that comprises the steps of:

exposing a substrate and electrodes to a vapor of a hydrophobic agent as a surface treatment by placing the substrate in the vapor of the hydrophobic agent and contacting the substrate and the electrodes with the vapor of the hydrophobic agent, the electrodes being formed of a material different from the substrate and being disposed on the substrate; and applying, according to an ink jet method, droplets of a liquid containing a material for the electroconductive thin film selectively to the treated surfaces of the substrate and the electrodes to which the hydrophobic agent is adhered to form the electroconductive thin film on the substrate surface between the electrodes and on a part of the surface of the electrodes, wherein the humidity in said exposing step is not more than 20%.

5. A process for producing a printed substrate, comprising the steps of:

exposing a substrate and a different component to an organic gas as a surface treatment by placing the substrate in an atmosphere of the organic gas and contacting the substrate and the different component with the organic gas, the different component being formed of a material different from the substrate and being disposed on the substrate; and applying, according to an ink jet method, droplets of a liquid selectively to the treated surfaces of the substrate and the different component to which an organic substance is adhered, so that a droplet of the liquid rests upon both the substrate and the different component, the liquid containing a material for a desired component to be formed on the substrate and on the different component, wherein said exposing step is performed in such a manner that, when the applying step is performed, both the contact angle between the droplet and the surface of the substrate and the contact angle between the droplet and the surface of the different component fall within a range of from 20° to 50°, and wherein the humidity in said exposing step is not more than 20%.

6. The process according to claim 5, further comprising the step of exposing the surface of the substrate and of the different component to light prior to said exposing step.

7. The process according to claim 5, further comprising the step of cleaning the surfaces of the substrate and of the different component prior to said exposing step.

8. The process according to claim 5, wherein said applying step is a step of applying droplets to plural positions on the substrate surface.

9. The process according to claim 5, wherein the surface tension of the liquid falls within a range of from 30 dyn/cm to 50 dyn/cm.

10. The process according to claim 5, wherein the ink-jet system is a system in which an ink is ejected by applying thermal energy to the ink.

11. The process according to claim 5, wherein the ink-jet system is a system in which an ink is ejected by applying mechanical energy to the ink.

12. A process for producing a printed substrate, comprising the steps of:

exposing a substrate and a different component to an organic gas as a surface treatment by placing the substrate in an atmosphere of the organic gas and contacting the substrate and the different component with the organic gas, the different component being formed of a material different from the substrate and being disposed on the substrate; and applying, according to an ink jet method, droplets of a liquid selectively to the treated surfaces of the substrate and the different component to which an organic substance is adhered, so that a droplet of the liquid rests upon both the substrate and the different component, the liquid containing a material for a desired component to be formed on the substrate and on the different component, wherein said exposing step is performed in such a manner that, when the applying step is performed, the difference in contact angle between the droplet and the surface of the substrate and the contact angle between the droplet and the surface of the different component is within 30°, and wherein the humidity in said exposing step is not more than 20%.

13. A process for producing an electron-emitting element comprising an electroconductive thin film that has an electron-emitting part and is between electrodes, wherein the electroconductive thin film is formed by a method that comprises the steps of:

exposing a substrate and electrodes to an organic gas as a surface treatment by placing the substrate in an atmosphere of the organic gas and contacting the substrate and the electrodes with the organic gas, the electrodes being formed of a material different from the substrate and being disposed on the substrate; and applying, according to an ink jet method, droplets of a liquid containing a material for the electroconductive thin film selectively to the treated surfaces of the substrate and the electrodes to which an organic substance is adhered to form the electroconductive thin film on the substrate surface between the electrodes and on a part of the surface of the electrodes, wherein said exposing step is performed in such a manner that, when the applying step is performed, both the contact angle between the droplet and the surface of the substrate and the contact angle between the droplet and the surface of the electrodes fall within a range of from 20° to 50°, and wherein the humidity in said exposing step is not more than 20%.

14. The process according to claim 13, further comprising the step of cleaning the surface of the substrate prior to said exposing step.

15. The process according to claim 13, further comprising the step of cleaning the surfaces of the substrate and of the electrodes prior to said exposing step.

16. The process according to claim 13, wherein the surface tension of the liquid falls within a range of from 30 dyn/cm to 50 dyn/cm.

17. The process according to claim 13, wherein the ink-jet system is a system in which an ink is ejected by applying thermal energy to the ink.

18. The process according to claim 13, wherein the ink-jet system is a system in which an ink is ejected by applying mechanical energy to the ink.

19. The process according to claim 13, wherein the electron-emitting element is a surface conduction type electron-emitting element.

20. A process for producing an electron-emitting element comprising an electroconductive thin film that has an electron-emitting part and is between electrodes, wherein the electroconductive thin film is formed by a method that comprises the steps of:

exposing a substrate and electrodes to an organic gas as a surface treatment by placing the substrate in an atmosphere of the organic gas and contacting the substrate and the electrodes with the organic gas, the electrodes being formed of a material different from the substrate and being disposed on the substrate; and applying, according to an ink jet method, droplets of a liquid containing a material for the electroconductive thin film selectively to the treated surfaces of the substrate and the electrodes to which an organic substance is adhered to form the electroconductive thin film on the substrate surface between the electrodes and on a part of the surface of the electrodes, wherein said exposing step is performed in such a manner that, when the applying step is performed, the difference in contact angle between the droplet and the surface of the substrate and the contact angle between the droplet and the surface of the electrodes is within 30°, and wherein the humidity in said exposing step is not more than 20%.

21. A process for producing an electron source in which a plurality of electron-emitting elements each comprising an electroconductive thin film having an electron-emitting part between electrodes are arranged on a substrate, wherein each of the electron-emitting elements is produced by the process according to any one of claims 13–20.

22. A process for producing an image-forming apparatus comprising an electron source in which a plurality of electron-emitting elements each comprising an electroconductive thin film having an electron-emitting part between electrodes are arranged on a substrate, and an image-forming member capable of forming images by virtue of irradiation of electrons from the electron source, wherein each of the electron-emitting elements is produced by the process according to any one of claims 13–20.

23. A process for producing a printed substrate comprising the steps of:

exposing a substrate and a different component to a vapor of a hydrophobic agent as a surface treatment by placing the substrate in the vapor of the hydrophobic agent and contacting the substrate and the different component with the vapor of the hydrophobic agent, the different component being formed of a material different from the substrate and being disposed on the substrate; and applying, according to an ink jet method, droplets of a liquid selectively to the treated surfaces of the substrate and the different component to which the hydrophobic agent is adhered, so that a droplet of the liquid rests upon both the substrate and the different component, the liquid containing a material for a desired component to be formed on the substrate and on the different component, wherein said exposing step is performed in such a manner that, when the applying step is performed, both the contact angle between the droplet and the surface of the substrate and the contact angle between the droplet and the surface of the different component fall within a range of from 20° to 50°, and wherein the humidity in said exposing step is not more than 20%.

24. The process according to claim 23, further comprising the step of exposing the surface of the substrate and of the different component to light prior to said exposing step.

25. The process according to claim 23, further comprising the step of cleaning the surfaces of the substrate and of the different component prior to said exposing step.

26. The process according to claim 23, wherein said applying step is a step of applying droplets to plural positions on the substrate surface.

27. The process according to claim 23, wherein the surface tension of the liquid falls within a range of from 30 dyn/cm to 50 dyn/cm.

28. The process according to claim 23, wherein the ink-jet system is a system in which an ink is ejected by applying thermal energy to the ink.

29. The process according to claim 23, wherein the ink-jet system is a system in which an ink is ejected by applying mechanical energy to the ink.

30. A process for producing an electron-emitting element comprising an electroconductive thin film that has an electron-emitting part and is between electrodes, wherein the electroconductive thin film is formed by a method that comprises the steps of:

exposing a substrate and electrodes to a vapor of a hydrophobic agent as a surface treatment by placing the substrate in the vapor of the hydrophobic agent, the electrodes being formed of a material different from the substrate and being disposed on the substrate; and applying, according to an ink jet method, droplets of a liquid containing a material for the electroconductive thin film selectively to the treated surfaces of the substrate and the electrodes to which the hydrophobic agent is adhered to form the electroconductive thin film on the substrate surface between the electrodes and on a part of the surface of the electrodes, wherein said exposing step is performed in such a manner that, when the applying step is performed, both the contact angle between the droplet and the surface of the substrate and the contact angle between the droplet and the surface of the substrate and the contact angle between the droplet and the surface of the electrodes fall within a range of from 20° to 50°, and wherein the humidity in said exposing step is not more than 20%.

31. The process according to claim 30, further comprising the step of cleaning the surface of the substrate prior to said exposing step.

32. The process according to claim 30, further comprising the step of cleaning the surfaces of the substrate and of the electrodes prior to said exposing step.

33. The process according to claim 30, wherein the surface tension of the liquid falls within a range of from 30 dyn/cm to 50 dyn/cm.

34. The process according to claim 30, wherein the ink-jet system is a system in which an ink is ejected by applying thermal energy to the ink.

35. The process according to claim 30, wherein the ink-jet system is a system in which an ink is ejected by applying mechanical energy to the ink.

36. The process according to claim 30, wherein the electron-emitting element is a surface conduction type electron-emitting element.

37. A process for producing a printed substrate comprising the steps of:

exposing a substrate and a different component to a vapor of a hydrophobic agent as a surface treatment by placing the substrate in the vapor of the hydrophobic agent and contacting the substrate and the different component with the vapor of the hydrophobic agent, the different component being formed of a material different from the substrate and being disposed on the substrate; and applying, according to an ink jet method, droplets of a liquid selectively to the treated surfaces of the substrate and the different component to which the hydrophobic agent is adhered, so that a droplet of the liquid rests upon both the substrate and the different component, the liquid containing a material for a desired component to be formed on the substrate and on the different component, wherein said exposing step is performed in such a manner that, when the applying step is performed, the difference in contact angle between the droplet and the surface of the substrate and the contact angle between the droplet and the surface of the different component is within 30°, and wherein the humidity in said exposing step is not more than 20%.

38. A process for producing an electron-emitting element comprising an electroconductive thin film that has an electron-emitting part and is between electrodes, wherein the electroconductive thin film is formed by a method that comprises the steps of:

exposing a substrate and electrodes to a vapor of a hydrophobic agent as a surface treatment by placing the substrate in the vapor of the hydrophobic agent, the electrodes being formed of a material different from the substrate and being disposed on the substrate; and applying, according to an ink jet method, droplets of a liquid containing a material for the electroconductive thin film selectively to the treated surfaces of the substrate and the electrodes to which the hydrophobic agent is adhered to form the electroconductive thin film on the substrate surface between the electrodes and on a part of the surface of the electrodes, wherein said exposing step is performed in such a manner that, when the applying step is performed, the difference in contact angle between the droplet and the surface of the substrate and the contact angle between the droplet and the surface of the electrodes is within 30°, and wherein the humidity in said exposing step is not more than 20%.

39. A process for producing an electron source in which a plurality of electron-emitting elements each comprising an electroconductive thin film having an electron-emitting part between electrodes are arranged on a substrate, wherein each of the electron-emitting elements is produced by the process according to any one of claims 30–36 or 38.

40. A process for producing an image-forming apparatus comprising an electron source in which a plurality of electron-emitting elements each comprising an electroconductive thin film having an electron-emitting part between electrodes are arranged on a substrate, and an image-forming member capable of forming images by virtue of irradiation of electrons from the electron source, wherein each of the electron-emitting elements is produced by the process according to any one of claims 30–36 or 38.

* * * * *

UNITED STATES PATENT AND TRADEMARK OFFICE
CERTIFICATE OF CORRECTION

PATENT NO.    : 6,613,399 B2
DATED         : September 2, 2003
INVENTOR(S)   : Masahiko Miyamoto et al.

It is certified that error appears in the above-identified patent and that said Letters Patent is hereby corrected as shown below:

Column 2,
Line 2, "herein below." should read -- hereinbelow. --;
Line 17, "fisure" should read -- fissure --;
Line 19, "fisure." should read -- fissure. --; and
Line 39, "(may" should read -- (may be --.

Column 4,
Line 33, "of the" should read -- of --; and
Line 34, "voltage" should read -- the voltage --.

Column 6,
Line 7, "$\mu$" (both occurrences) should read -- $\mu m$ --; and
Line 25, "fisure" should read -- fissure --.

Column 7,
Line 16, "it is" should read -- is --.

Column 11,
Line 21, "(called also" should read -- (also called --.

Column 14,
Lines 39 and 48, "run" should read -- ran --.

Column 18,
Line 47, "very formed" should read -- very well-formed --.

Column 19,
Line 48, "gage" should read -- gauge --.

Column 23,
Line 66, "An" should read -- an --.

Column 24,
Line 65, "aminopropyl-dimethylethoxysilane" should read
-- aminopropyldimethylethoxysilane --.

UNITED STATES PATENT AND TRADEMARK OFFICE
CERTIFICATE OF CORRECTION

PATENT NO. : 6,613,399 B2
DATED : September 2, 2003
INVENTOR(S) : Masahiko Miyamoto et al.

It is certified that error appears in the above-identified patent and that said Letters Patent is hereby corrected as shown below:

Column 26,
Line 28, "in" should read -- in Referential Example 3. --; and
Line 30, "REFERENTIAL EXAMPLE 3" should be deleted.

Column 29,
Line 55, "45±+8°" should read -- 45±8° --.

Column 30,
Table 5, "± 3°0" should read -- ± 3° --.

Column 31,
Line 43, "SiOX" should read -- $SiO_x$ --.

Column 33,
Table 7, "± 1°0" should read -- ± 1° --.

Column 36,
Line 18, "$T_{Syc}$" should read -- $T_{Sync}$ --.

Column 37,
Line 27, "3-aminopropyldimethyl-ethoxysilane" should read
-- 3-aminopropyldimethylethoxysilane --.
Line 53, "substrate 1." should read -- substrate 91. --.

Signed and Sealed this

Twenty-third Day of March, 2004

JON W. DUDAS
*Acting Director of the United States Patent and Trademark Office*